(12) United States Patent
von Schwerin

(10) Patent No.: US 7,291,533 B2
(45) Date of Patent: Nov. 6, 2007

(54) METHOD FOR PRODUCTION OF TRENCH DRAM CELLS AND A TRENCH DRAM CELL ARRAY WITH FIN FIELD-EFFECT TRANSISTORS WITH A CURVED CHANNEL (CFET—CURVED FETS)

(75) Inventor: Ulrike Gruening von Schwerin, Munich (DE)

(73) Assignee: Infineon Technologies, AG, Neubiberg (DE)

( * ) Notice: Subject to any disclaimer, the term of this patent is extended or adjusted under 35 U.S.C. 154(b) by 280 days.

(21) Appl. No.: 11/117,712

(22) Filed: Apr. 29, 2005

(65) Prior Publication Data

US 2005/0245024 A1    Nov. 3, 2005

(30) Foreign Application Priority Data

Apr. 29, 2004   (DE) ...................... 10 2004 021 052

(51) Int. Cl.
*H01L 21/336* (2006.01)
(52) U.S. Cl. ...................... 438/270; 438/212; 438/259; 257/E21.651
(58) Field of Classification Search ................ 438/173, 438/192, 209
See application file for complete search history.

(56) References Cited

U.S. PATENT DOCUMENTS 5,945,707 A    8/1999   Bronner et al.

6,998,676 B2 *  2/2006   Kondo et al. ................ 257/329
2001/0044190 A1 * 11/2001   Heo et al. .................... 438/270

FOREIGN PATENT DOCUMENTS

DE        103 61 695 B3    2/2005

* cited by examiner

*Primary Examiner*—Michael Lebentritt
*Assistant Examiner*—Cheung Lee
(74) *Attorney, Agent, or Firm*—Edell, Shapiro & Finnan, LLC

(57) ABSTRACT

A method for producing trench DRAM cells, each having a trench capacitor and a fin field-effect transistor with a curved channel (CFET) for addressing the trench capacitor, is described. The memory cells are arranged in cell rows offset with respect to one another and are separated from one another by strip-like isolator structures. Buried word lines are embedded in the isolator structures and run along the longitudinal faces of semiconductor fins which are formed along the cell rows and include the active regions of the selection transistors. The internal electrodes of the trench capacitors are each connected with a low impedance via surface straps to first source/drain areas of the respective selection transistors. In one embodiment, one word line is formed for each isolator structure using an open bit line architecture, with only every alternate word line being used for addressing. A reinforced word line/trench isolator is provided between the word lines and the trench capacitors.

12 Claims, 20 Drawing Sheets

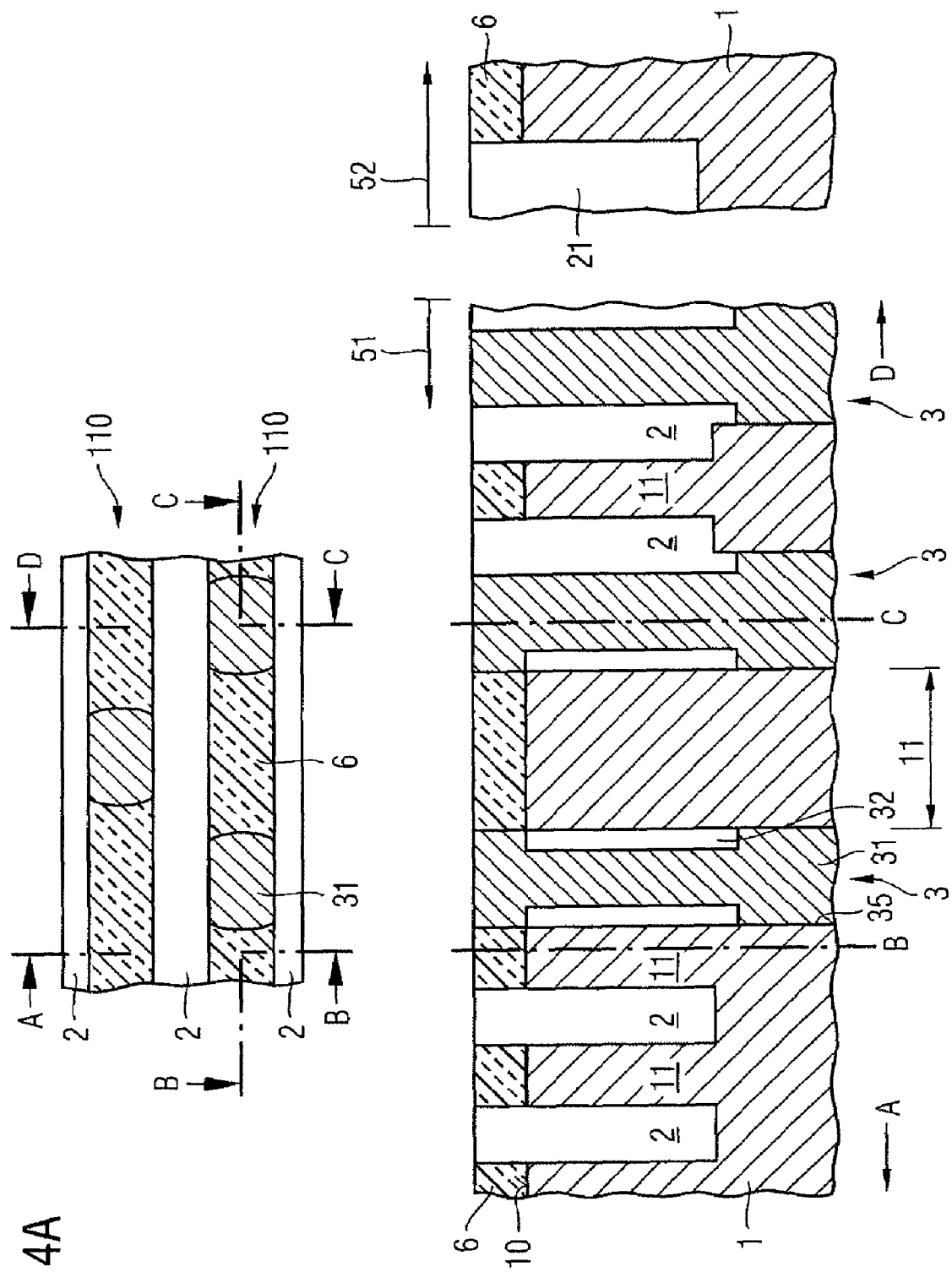

Section I-I

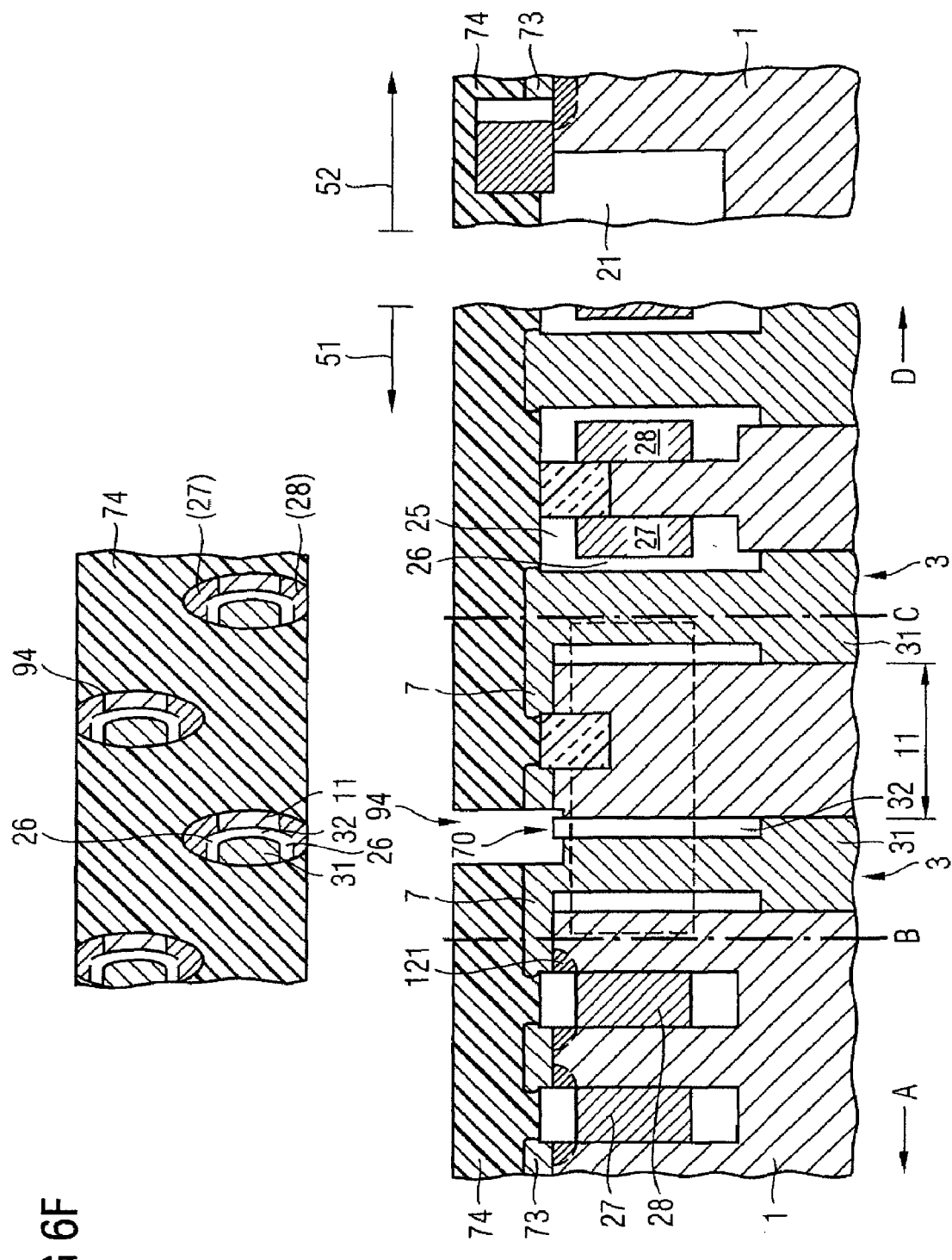

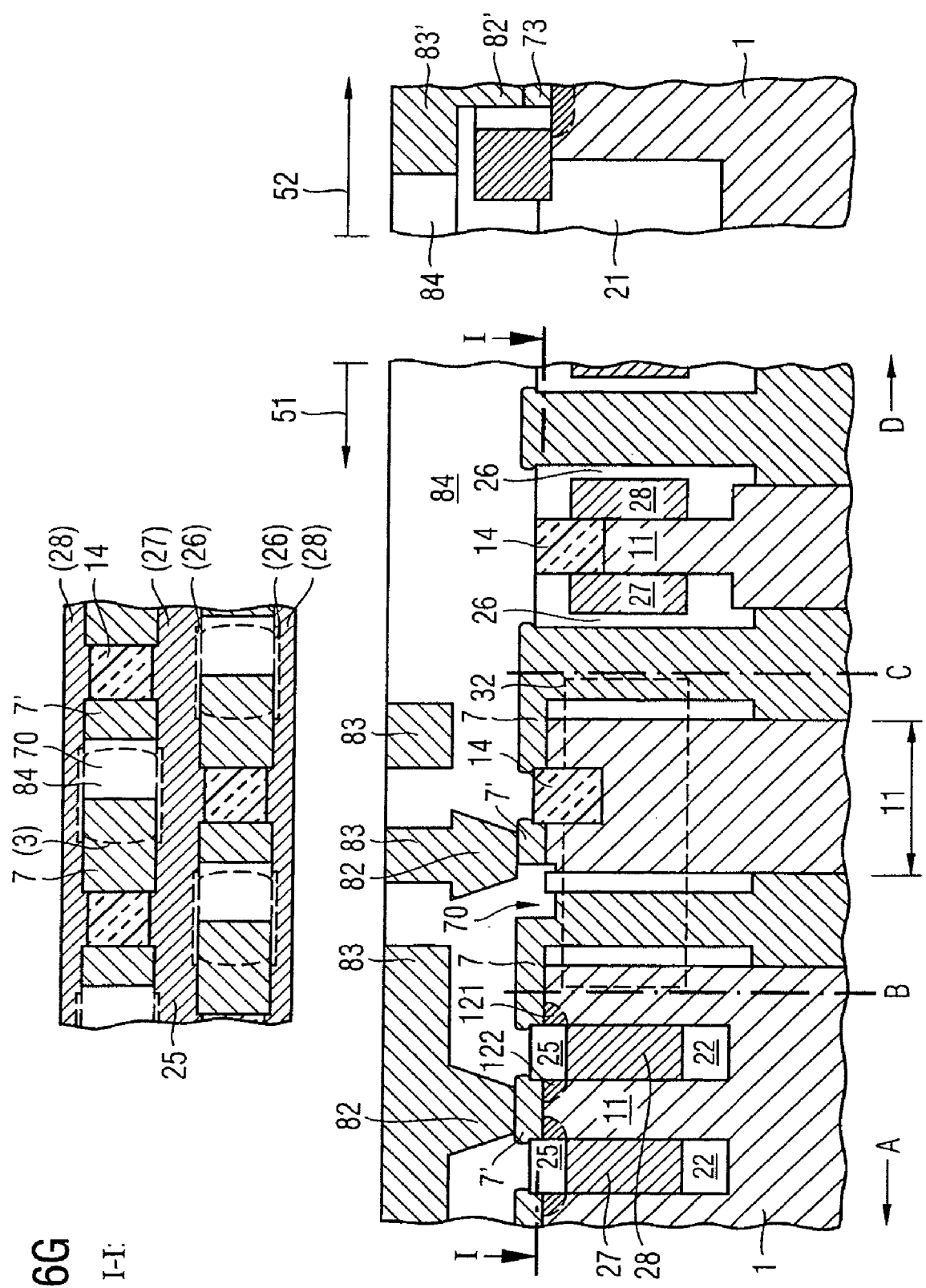

METHOD FOR PRODUCTION OF TRENCH DRAM CELLS AND A TRENCH DRAM CELL ARRAY WITH FIN FIELD-EFFECT TRANSISTORS WITH A CURVED CHANNEL (CFET—CURVED FETS)

CROSS REFERENCE TO RELATED APPLICATIONS

This Application claims Priority Under 35 USC §119 To German Application No. DE 10 2004 021 052.7, Filed On Apr. 29, 2004, And Titled "Method For Production Of Trench Dram Cells And A Trench Dram Cell Array With Fin Field-Effect Transistors With A Curved Channel (Cfet-Curved Fets)," the entire contents of which are hereby incorporated by reference.

FIELD OF THE INVENTION

The invention relates to a method for production of trench DRAM cells having fin field-effect transistors as selection transistors, and to a trench DRAM cell array having fin field-effect transistors with a curved channel (CFET) as selection transistors.

BACKGROUND

Memory cells of dynamic random access memories (DRAMs) each have a storage capacitor for storage of electrical charge which characterizes the information content of the memory cell, as well as a selection transistor for addressing the storage capacitor. In the case of trench DRAM cells, the storage capacitors are in the form of trench capacitors which are oriented on hole trenches incorporated in a semiconductor substrate from one substrate surface. A first electrode or internal electrode is in this case in the form of a filling in the hole trench. The opposing or outer electrode is in the form of a doped region in a section of the semiconductor substrate which surrounds a lower section of the hole trench. The filling in the hole trench is isolated by means of a collar isolator from the surrounding semiconductor substrate in an upper section of the hole trench, which is formed between the substrate surface and the lower section. The internal electrode is isolated from the outer electrode by a capacitor dielectric that is provided on the wall of the hole trench.

The selection transistor for the memory cell is in the form of a field-effect transistor, whose active region is formed in the semiconductor substrate. The active region has two source/drain areas, which are separated by a body area. A gate electrode controls the charge carrier distribution in the body area between the two source/drain areas.

When the memory cell is not being addressed, the two source/drain areas are isolated from one another. When the memory cell is being addressed, moving charge carriers in a channel area of the body area which is adjacent to the gate dielectric are enriched by a suitable potential on the gate electrode, so that a conductive channel is formed between the two source/drain areas.

The isolation characteristics of the selection transistor when the memory cell is not being addressed are dependent on the length of the channel which connects the two source/drain areas when the memory cell is being addressed.

In conventional cell array field-effect transistors with a recessed channel (recess channel array transistor, RCAT), the two source/drain areas are arranged on a plane which is horizontal with respect to the substrate surface. The gate electrode is provided in a recess trench which is incorporated in the semiconductor substrate, between the two source/drain areas of the field-effect transistor. The distance between the two source/drain areas as well as the depth to which the recess trench is incorporated in the semiconductor substrate results in an effective channel length Leff.

An arrangement having DRAM trench memory cells and having fin field-effect transistors with a gate electrode recessed in the semiconductor substrate, as selection transistors, is described in U.S. Pat. No. 5,945,707.

German Patent Application No. 10361695.0 discloses a field-effect transistor with a curved channel (curved FET), as depicted in FIG. 1. In particular, FIG. 1 depicts a longitudinal section through a CFET on the left, and a cross section at right angles to this on the right. An active region 12 of the CFET is formed in a semiconductor fin 11 which is formed from the semiconductor substrate 1. The active region 12 has two source/drain areas 121, 122 as well a body area 123. The two source/drain areas 121, 122 are each in the form of doped regions at mutually opposite ends of the semiconductor fin, and are adjacent to a substrate surface 10 of the semiconductor substrate 1. A gate trench structure or groove filling 14 is incorporated in the semiconductor fin 11 between the two source/drain areas 121, 122. The channel length of the CFET results from the depth to which the groove filling 14 is incorporated. The body area 123 is adjacent to the two source/drain areas 121, 122 and extends to underneath the lower edge of the groove filling 14.

A gate electrode of the CFET 4 has two gate electrode sections 23, 23' which are opposite one another on the longitudinal faces of the semiconductor fin 11 and are each isolated from the semiconductor fin 11 by a gate dielectric 20. The CFET 4 is isolated by isolator structures 2 from structures which are orthogonally adjacent to the longitudinal faces. In the longitudinal section, the gate electrode sections 23, 23' are arranged on a plane parallel to the section plane, and are represented by dashed lines.

In a trench DRAM cell array, the selection transistors are arranged together with the storage capacitors in each case one behind the other and electrically isolated from one another to form cell rows. The cell rows are each separated from one another by one of the isolator structures 2.

During operation of the CFET 4, a conductive channel which connects the two source/drain areas 121, 122 to one another is formed by a suitable potential on the gate electrode sections 23, 23', in a channel area 15 of the body area 123 adjacent to the gate dielectric 20. A cell current 16 flows through the channel. The length of the channel is governed essentially by the depth to which the gate trench structure 14 is incorporated. The effective channel width is governed by the extent of the gate electrode sections 23, 23' in the direction at right angles to the substrate surface 10.

One trench capacitor is in each case arranged adjacent to one of the ends of the semiconductor fin in a trench DRAM cell. In order to connect the internal electrode of the trench capacitor to the first source/drain area, the collar isolator is re-formed in a section adjacent to the semiconductor fin, so that the internal electrode is directly adjacent to the active region of the respectively associated CFET in the area of a buried strap window. In general, a highly doped region is formed by outward diffusion of a dopant from a dopant carrier as a buried connection (buried strap) between the internal electrode and the first source/drain area.

The resistance of the buried strap is comparatively high. The disturbing influence of the comparatively high resistance becomes more pronounced the smaller the absolute dimensions of the memory cell, for example because the cross-sectional area of the buried strap window decreases.

Furthermore, two strands of mutually adjacent word lines are provided in each of the isolator structures, which each form the gate electrode sections of the selection transistors in places, and can be reliably isolated from one another. Owing to the short distance between the two word line strands, there is high coupling capacitance between mutually adjacent word lines. In order to reduce the word line series resistance, the isolator structures can be provided with a high aspect ratio, although this is technologically difficult to produce.

SUMMARY

In accordance with the present invention, a method for producing trench DRAM cells comprises providing a semiconductor substrate, and introducing trench capacitors into the semiconductor substrate, where the trench capacitors are arranged to form cell rows and each trench capacitor includes an internal electrode that is isolated from the semiconductor substrate. Strip-like isolator structures and semiconductor fins are introduced into the semiconductor substrate, where the isolator structures separate each of the cell rows from each other and include buried word lines, each semiconductor fin is bounded by two adjacent isolator structures and two adjacent trench capacitors, and the semiconductor fins are formed from the semiconductor substrate within the cell rows. Gate trench structures are introduced into the semiconductor fins, where each gate trench structure is introduced into a central section of a corresponding semiconductor fin. The method further comprises selectively growing provisional connections on the internal electrodes and on outer sections of the semiconductor fins, where each internal electrode is connected via a corresponding provisional connection to two semiconductor fins that are adjacent in a corresponding cell row, and the provisional connections remain separated from each other above the isolator structures and the gate trench structures. Portions of the provisional connections are removed between the internal electrodes, and from one semiconductor fin for each set of adjacent semiconductor fins, so as to form surface connections, where each trench capacitor is connected to a single semiconductor fin via a corresponding surface connection.

In another embodiment of the present invention, a trench DRAM cell array disposed within a semiconductor substrate comprises word lines embedded in strip-like isolator structures and, in selected locations, form gate electrodes of selection transistors, and at least two memory cells arranged in cell rows that are separated from each other by the isolator structures. Each memory cell includes a trench capacitor oriented on a hole trench that is incorporated in the semiconductor substrate from one substrate surface, the trench capacitor structure including an internal electrode that is isolated from the semiconductor substrate, and a selection transistor including an active region in a semiconductor fin that is bounded by two adjacent isolator structures and two trench capacitors that are adjacent within the same cell row. Each selection transistor includes a first source/drain area that is connected to the internal electrode of the trench capacitor and a second source/drain area that is separated from the first source/drain area, and a gate trench structure being incorporated in the semiconductor fin between the first and second source/drain areas and with a conductive channel being formed, when the selection transistor is switched on, between the first and second source/drain areas along at least one vertical side wall of the semiconductor fin and running underneath the gate trench structure. The DRAM cell array further comprises surface connections comprising silicon or a silicon compound, where the surface connections are arranged above the substrate surface such that each surface connection electrically and conductively connects the first source/drain area of the selection transistor and the internal electrode of the trench capacitor of a corresponding memory cell to each other.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIGS. 4A-4I depict cross-sectional views in various stages of production of a trench DRAM cell array with a folded bit line architecture as depicted in FIG. 2 and in accordance with a first exemplary embodiment of the invention;

FIG. 6A-6G depict cross-sectional views of a trench DRAM cell array with an open bit line architecture formed according to a second exemplary embodiment of the invention.

DETAILED DESCRIPTION OF THE PREFERRED EMBODIMENTS

Figure 1:
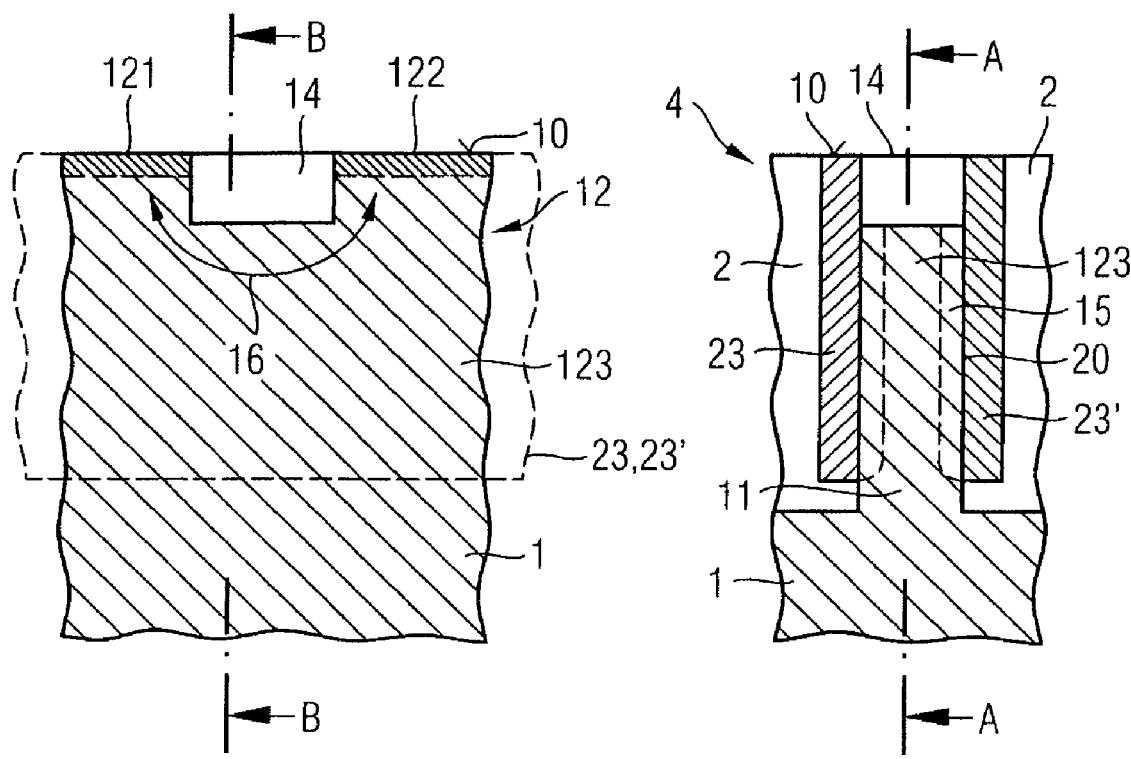
FIG. 1 depicts a longitudinal section and a cross section through a CFET.

The present invention provides methods for producing trench DRAM cells having CFETs as selection transistors, which makes it possible to reduce the connection resistance between the internal electrode of the trench capacitor and the source/drain area which is connected to the internal electrode. In addition, a trench DRAM cell array is produced in accordance with the invention having memory cells each having a CFET as the selection transistor and having a low and stable connection resistance between the selection transistor and the respective trench capacitor.

In the production of trench DRAM cells, a semiconductor substrate is first provided. Trench capacitors are incorporated in the semiconductor substrate and are arranged in mutually parallel cell rows and in a suitable manner (e.g., at equal intervals with respect to each other). The trench capacitors are each oriented on a hole trench. The internal electrodes of the trench capacitors are each provided as a filling for the hole trenches which are incorporated in the semiconductor substrate from a substrate surface, and are isolated from the semiconductor substrate.

The cell rows are separated from one another by in each case one strip-like isolator structure which is provided between two cell rows. Buried word lines are embedded in the isolator structures. Within the cell rows, semiconductor fins originate from the semiconductor substrate, which are each bounded by two adjacent trench capacitors in the longitudinal direction, and two adjacent isolator structures in the lateral direction.

Outer sections of the semiconductor fins are in each case defined adjacent to the trench capacitors. A central section of the semiconductor fin is defined between the two outer sections of the semiconductor fins. A gate trench structure is incorporated in the central section of the respective semiconductor fin, and is adjacent to the two isolator structures that are adjacent to the respective semiconductor fin.

In one significant step of the invention, semiconductor material is grown selectively on the internal electrodes and on the outer sections of the semiconductor fins. In this case, provisional connections are produced from the semiconductor material that is being grown and each connect the internal electrode of a trench capacitor to the two semiconductor fins which are in each case adjacent to the trench capacitor in the cell row, with the provisional connections above the isolator structures and above the gate trench structures remaining separated from one another.

The provisional connections are interrupted or removed between the internal electrodes and in each case one of the two adjacent semiconductor fins, so that surface connections (surface straps) are produced from the provisional connections, via each of which a trench capacitor or the internal electrode of a trench capacitor is connected to one, and only one, semiconductor fin.

The method according to the invention advantageously reduces the connection resistance between the internal electrode of the trench capacitor of the memory cell and the selection transistor.

The provisional connections are in each case preferably only interrupted such that a bit contact connection (BC strap), which rests on the second source/drain area, in each case is produced from the respective provisional connection in addition to the surface connection. The bit contact connection is located in a section of the semiconductor fin in which the second source/drain area of the CFET is formed. The second source/drain area is connected via a bit contact to a bit line or data line. The bit contact connection advantageously reduces the contact resistance between the second source/drain area, which is formed in the monocrystalline semiconductor substrate, and the bit contact.

A collar isolator is in each case formed in an upper section of the trench capacitors adjacent to the substrate surface, and is used to isolate the internal electrode of the respective trench capacitor from the semiconductor substrate. The collar isolators are preferably thinned before the provision of the internal electrodes in a section which is close to the surface and is adjacent to the substrate surface, thus allowing and/or improving the growth over the collar isolators of the semiconductor material which is grown or deposited.

Before the incorporation of the trench capacitors and of the isolator structures, a protective layer is preferably provided, through which the trench capacitors, the isolator structures and the gate trench structures are incorporated in the semiconductor substrate. Once the protective layer has been removed, those sections (and only those sections) of the semiconductor substrate are exposed which are provided in addition to the internal electrodes for the growth of the semiconductor material for the surface straps or BC straps.

In order to incorporate the gate trench structures in the semiconductor substrate, a mask layer is preferably applied first, and the mask layer is photolithographically structured on the process surface which is formed in places by the protective layer, the isolator structures and the filling of the trench capacitors. A groove mask is produced from the mask layer with window openings which correspond to each of the central sections of the semiconductor fins.

The groove mask is imaged in the protective layer, with sections of the protective layer which are arranged underneath the window openings in the groove mask being reformed or removed as far as the substrate surface.

The structure of the protective layer is imaged in the semiconductor substrate, with gate trenches being incorporated in the central sections of the semiconductor fins.

The gate trenches are filled with the gate trench structures. The filling of the gate trenches preferably includes oxidation of the semiconductor substrate, deposition of oxynitride, and the oxynitride being etched back as far as the upper edge of the protective layer.

The procedure for incorporation of the isolator structures is dependent on the desired bit line architecture.

According to a first preferred embodiment of the method according to the invention, a so-called folded bit line architecture is produced. Isolator trenches are incorporated in the semiconductor substrate, through the protective layer. Base isolator structures are formed in the isolator trenches underneath a lower edge of the word lines.

A gate dielectric is provided along the exposed vertical side walls of the semiconductor fins, for example by oxidation of the semiconductor substrate or by deposition of a dielectric material.

Strands of spacer word lines are formed along the longitudinal walls of the semiconductor fins in the isolator trenches, for example by conformal deposition and anisotropic re-forming of a conductive material. A dielectric material is applied, is used to fill the isolator trenches, and the respective spacer word lines which are provided in the same isolator trench are isolated from one another.

One word line is in each case formed by two spacer word lines or word line strands which are each opposite one another on the associated cell row or the semiconductor fins of the associated cell row. Each of the word lines which are formed in two word line strands address all of the memory cells that are formed along the respectively associated cell row. The two word line strands which are formed in the same isolator trench are associated with two different word lines, which can be controlled independently of one another.

Adjacent cell rows are in each case provided offset through half the cell length with respect to one another. The bit or data lines are formed at right angles to the word lines. Each word line addresses only every alternate bit line, so that mutually adjacent bit lines can be connected to a common read amplifier, in the sense of a folded bit line architecture, with that bit line which is not being addressed preferably being used as a reference bit line for the other bit line which is being addressed. The addressed bit line and the respectively associated reference bit lines are well matched to one another. The influence of disturbances and noise phenomena on the result of the reading process is reduced.

According to a second preferred embodiment for the incorporation of the isolator structures, the word lines are in the form of an open bit line architecture (open bit line). The isolator trenches are incorporated in the semiconductor substrate and are formed with provisional structures composed of a dielectric material. Semiconductor material is grown selectively on the filling material of the internal electrodes of the trench capacitors. The semiconductor material grows vertically and starting from the exposed surface of the trench capacitor, or from its filling, in the horizontal direction as well. The semiconductor material that is grown results in a trench auxiliary mask with mask sections that are adjusted with respect to the trench capacitors. The mask sections in each case cover sections of the provisional structures that are adjacent to the trench capacitors.

The provisional structures are re-formed anisotropically outside the mask sections. In this case, sections of the provisional structures which are adjacent to the semiconductor fins are re-formed as far as the lower edge of the word lines. Sections which are adjacent to the trench capacitors underneath the mask sections are retained, and each form word line trench isolators that are associated with a trench capacitor.

A gate dielectric is provided on the exposed vertical side walls of the semiconductor fins. In the exposed area, the isolator trenches are filled with a conductive material as far as the upper edge of the word lines. A word line is formed for each isolator trench by the conductive material.

The word lines are in this case each associated with the two cell rows which are separated from one another by the respective isolator trench. Along its extent along the cell rows, each word line alternately addresses memory cells in one cell row and memory cells in the other cell row. Only every alternate word line is required for addressing the memory cells. The other word lines are driven as backgate lines.

Since each word line addresses all of the bit lines of the relevant cell array, the read signals can no longer be referenced to the respectively adjacent bit line. This results in an open bit line architecture. The word lines are advantageously well isolated and decoupled from one another by the cell rows. The aspect ratio for processing in the isolator trenches is reduced. The distance between the word lines and the respectively adjacent trench capacitors is increased, thus reducing the coupling capacitance between the word lines and the internal electrodes of the adjacent trench capacitors.

If the word lines in the folded bit line structure are isolated from the trench capacitors adjacent to the respective word line by means of a comparatively thin oxide layer which is grown on the polycrystalline internal electrode in the course of the formation of the gate oxide, then the word line trench isolator advantageously occurs as a reinforced isolation layer instead in the open bit line structure. The electrical isolation between the trench capacitors and the word lines is improved.

After the removal of the protective layer, the semiconductor substrate is preferably provided with a sacrificial oxide. After provision of the sacrificial oxide, implantations are carried out in order to form doped trenches in the area of the source/drain areas of the CFETs.

In a further preferred manner, the sacrificial oxide is removed before the growth of the semiconductor material. The doping of the outer sections of the semiconductor webs before the growth of the surface connections in each case results in a semiconductor body of a field-effect transistor with a curved channel being produced from the semiconductor fins, with the gate electrode of this field-effect transistor being in the form of a section of a word line.

In order to reduce the resistance of the surface connections and the contact resistance to the surface connections, the surface connections are silicided. The siliciding process can advantageously be carried out before the interruption of the provisional connections, on a material-selective, self-adjusting basis.

The trench DRAM cell array according to the invention has word lines which are embedded in strip-like isolator structures and, in places, form gate electrodes of selection transistors, as well as in each case two or more memory cells which are arranged in cell rows that are separated from one another by the parallel isolator structures.

The memory cells each have a trench capacitor for storing of an electrical charge which characterizes the data content of the memory cell, and a selection transistor for addressing of the trench capacitor. The trench capacitor is oriented on a hole trench which is incorporated in the semiconductor substrate from a substrate surface. An internal electrode of the trench capacitor is provided as filling for the hole trench, and is isolated from the semiconductor substrate.

An active region of the selection transistor is formed in a semiconductor fin which is bounded by in each case two adjacent isolator structures and two trench capacitors which are adjacent within the same cell row. The active region furthermore has a first source/drain area which is connected to the internal electrode of the trench capacitor, and a second source/drain area which is separated from the first source/drain area, each of which are provided as doped regions within the semiconductor fin. A gate trench structure is incorporated in the semiconductor fin between the two source/drain areas, so that a conductive channel is formed between the two source/drain areas, along at least one vertical side wall of the semiconductor fin and underneath the gate trench structure, when the selection transistor is switched on.

According to the invention, the internal electrode of the trench capacitor and the first source/drain area of the selection transistor are connected to an electrically conductive surface connection, which is arranged above the substrate surface and is composed of a semiconductor material.

The semiconductor material is preferably silicon, or contains silicon or a silicon compound.

The electrical resistance between the first source/drain area and the internal electrode is reduced by the surface connection being formed in a stable manner.

The surface connections are preferably at least partially formed from a metal silicide. This advantageously further reduces the resistance of the surface connection.

A bit contact connection, which is in the form of a surface connection, is preferably provided on the substrate surface above the second source/drain area. The contact resistance between the second source/drain area and a bit contact which provides a connection for the respectively associated bit line is reduced.

In a trench DRAM cell array with an open bit line architecture, only one word line is provided for each isolator trench. The capacitance between adjacent word lines is thus considerably reduced. The isolation of the word lines from one another is simplified, and the resistance of the word lines can be reduced. The aspect ratios are reduced during the processing of the isolator trenches.

The distance between the word lines and the respectively adjacent trench capacitors is increased, thus reducing the coupling capacitance between the word lines and the internal electrodes of the respectively adjacent trench capacitors.

The electrical isolation between the trench capacitors and the word lines is improved by means of a word line trench isolator, which is independent of the formation of the gate oxide, as a reinforced isolation layer between the word lines and the internal electrodes of the respectively adjacent trench capacitors.

The invention and its advantages are described below in relation to the following FIGS. 2-6.

Figure 2:
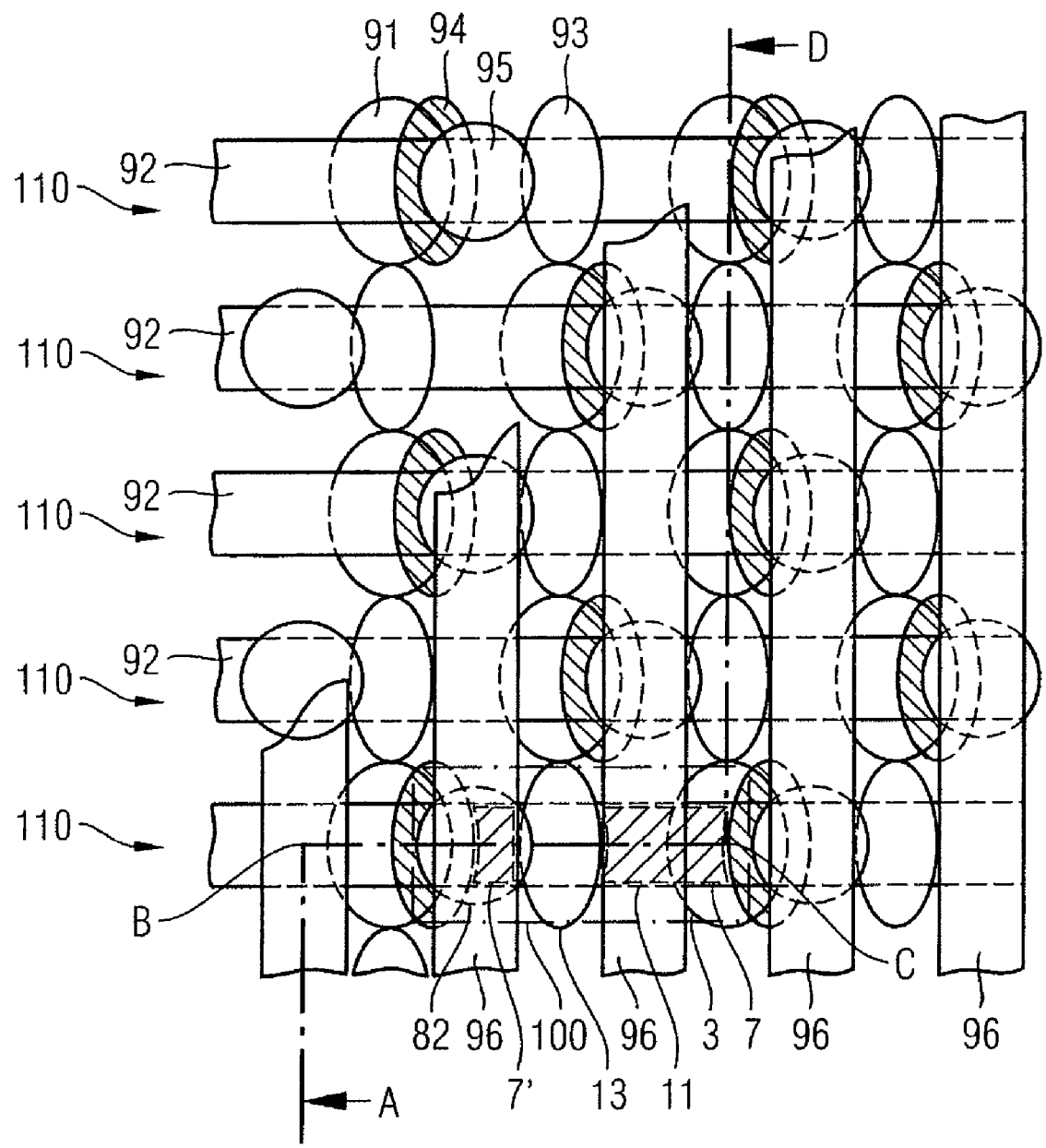
FIG. 2 depicts a plan view of a mask stack for forming a trench DRAM cell array with a section line A-D corresponding to FIGS. 4 and 6.

FIG. 2 shows a stack of masks for forming a trench DRAM cell array in a semiconductor substrate. In particular, FIG. 2 shows a plan view of a detail of the trench DRAM cell array, with the openings of hole masks and the fin structures or trench structures (which result from the strip masks) of strip masks. In the area of a memory cell 100, reference is made to the structures formed using the masks.

The window openings 91 in a trench mask correspond to trench capacitors 3 formed in the semiconductor substrate. The trench capacitors 3 are arranged within cell rows 110, in each case separated by the length of one cell. Respectively adjacent cell rows 110 are provided offset by half the cell length with respect to one another. In a corresponding manner to an isolator trench mask with fin sections 92, parallel isolator trenches of the same width are incorporated like strips between the cell rows 110. Corresponding to the fin sections 92, semiconductor fins 11 are in this case formed within the cell row 110, in each case between two adjacent trench capacitors 3. Central sections of the semiconductor fins 111 are re-formed, with gate trenches (grooves) 13 being formed in the semiconductor fins 11 in the process, in the area of window openings 93 in a gate trench or groove mask.

Provisional connections that are provided on the semiconductor fins 11 using a non-photolithographic method, extend as an extension of the semiconductor fins 11 over the openings of the trench capacitors 3, and are interrupted above the gate trenches 13. The provisional connections are re-formed or removed in sections in the area of window openings 94 in a cut mask.

In each case one surface connection or surface strap 7 is produced from the provisional connections between in each case one trench capacitor 3 and a semiconductor fin 11 (which in this example is adjacent on the left), as well as a bit contact connection or BC strap 7' between the trench capacitor 3 and the gate trench 13 of the memory cell which is adjacent to the same cell row 110 on the right. Bit contacts 82 which rest on the bit contact connections are formed in a corresponding manner to window openings 95 in a bit contact mask. The bit contacts 82 are connected by means of bit lines, which each bit contact running at right angles to the cell rows 110, corresponding to fin sections 96 of a bit line mask.

FIG. 2 further shows the trench capacitor 3, the semiconductor fin 11 which is adjacent to the trench capacitor 3 on the left, and the bit contact 82 of one of the memory cells 100. The semiconductor fin 11 is recessed by means of the gate trench 13 between the trench capacitor 3 and the bit contact 82. The semiconductor fin 11 forms an active region of a selection transistor, in the form of a CFET, of the memory cell 100. A gate electrode of the CFET is formed by sections of a word line and gate conductor structure, which are formed on both sides along the longitudinal faces of the semiconductor fin 11.

A first source/drain area of the CFET is formed underneath the surface strap 7 between the gate trench 13 and the trench capacitor 3 in the semiconductor fin 11, and is connected to an internal electrode of the trench capacitor 3. A second source/drain area of the CFET is formed underneath the bit contact 82 in the semiconductor fin 11. A conductive channel is formed in the active region of the CFET as a function of a potential on the gate electrode, connects the first source/drain area to the second source/drain area, and in the process is passed underneath the gate trench 13.

Figure 3:
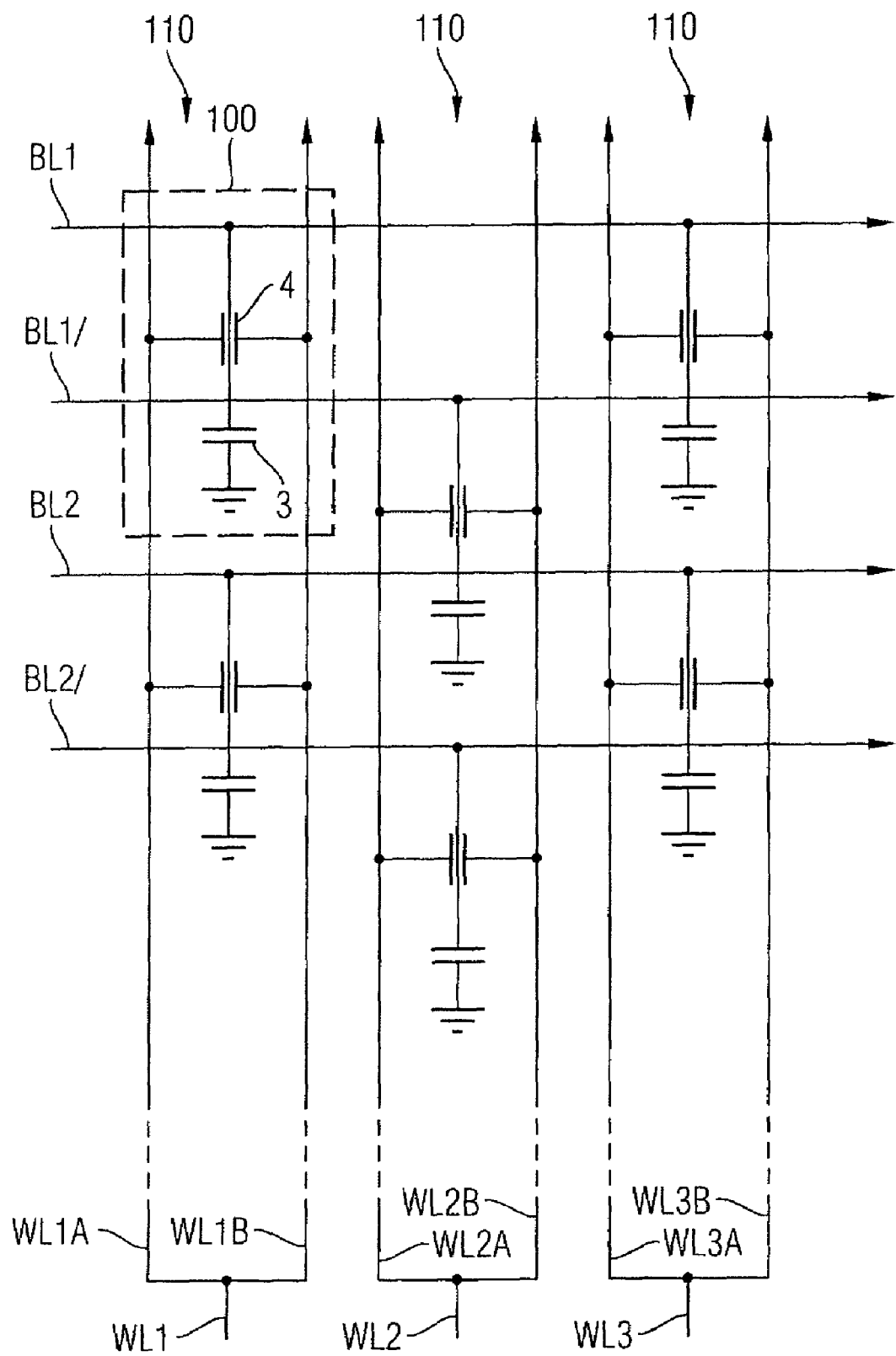
FIG. 3 depicts a topographic circuit diagram of a trench DRAM cell array as shown in FIGS. 4A-4I, with a folded bit line architecture.

A schematic circuit diagram of the trench DRAM cell array of FIG. 2, and using a folded bit line architecture, is depicted in FIG. 3. The word lines WL1, WL2, WL3 are provided with in each case two parallel word line strands WLnA, WLnB which are opposite one another on the cell rows. In this case, two word line strands WLnB, WL(n+1)A of different word lines WLn, WL(n+1) are in each case arranged within the same isolator trench. The two word line strands WLnA, WLnB of one word line WLn act as a double-sided gate electrode to control the selection transistors 4 for the memory cells 100. The selection transistors 4 control the charging and discharging of a storage capacitor 3 in the form of a trench capacitor. The charge for the trench capacitors 3 is supplied and dissipated, respectively, via data and bit lines BLn, BLn/. The memory cells 100 of respectively adjacent cell rows are each arranged offset by half the cell length with respect to one another, so that the respectively adjacent bit lines BLn, BLn/, BLn+1 are associated with respect to the adjacent word lines WLn, WLn+1. Of two mutually adjacent bit lines BLn, BLn/, only one is in each case addressed, so that the respective other line is used as the reference line while the first is being read.

FIGS. 4A-4I show cross sections along the line A-B-C-D from FIG. 2 in various phases of an exemplary embodiment of the method according to the invention for production of a trench DRAM cell array with CFETs as selection transistors. Plan views of the respective structures are in each case attached to the cross sections, with the section lines identified.

A semiconductor substrate 1 is produced, and a protective layer 6 is applied to one substrate surface 10 of the semiconductor substrate 1. The protective layer 6 is formed from silicon nitride. The protective layer 6 (pad nitride) may be covered by further layers, such as a potential bonding layer.

Trench capacitors 3 are formed in the semiconductor substrate 1. The trench capacitors 3 are in this case each oriented on a hole trench which is incorporated in the semiconductor substrate 1 through the protective layer 6. Away from the illustrated area, an outer electrode of the trench capacitor 3 is formed as a doped region in a section of the semiconductor substrate 1 which surrounds a lower section of the hole trench. An internal electrode 31 of the trench capacitor 3 is defined by filling the hole trench with a conductive material. In the lower section of the hole trench, the filling is isolated from the outer electrode by a capacitor dielectric 35 which is provided on the wall of the hole trench. Between the substrate surface 10 and the lower section, the hole trench is clad with a collar isolator 32, which isolates and decouples the internal electrode 31 of the trench capacitor 3 from the surrounding semiconductor substrate 1. The collar isolator 32 is re-formed above the substrate surface 10, with its thickness being reduced and thinned.

Strip-like, parallel isolator trenches 2 with the same width are incorporated between the trench capacitors 3 arranged to form cell rows 110, and are filled with a dielectric material.

A semiconductor fin 11, which is formed from the semiconductor substrate 1, within the cell row is bounded by two mutually adjacent trench capacitors 3 in accordance with the cross section B-C (as illustrated in FIG. 4A) along a cell row. The semiconductor fin 11 is isolated from both trench capacitors 3 by the respective collar isolators 32. As can be seen from the section C-D of the cross section through the center point of a trench capacitor 3 at right angles to the cell row, the trench capacitors 3 are in each case isolated by isolator structures 2 from semiconductor fins 11 which are arranged in the respectively adjacent cell rows.

In addition to the cross section through a cell array 51, FIG. 1A also shows a cross section through a simultaneously processed supporting circuit area 52 of a DRAM. Flat trench isolator structures 21 are formed in the supporting circuit area 52, outside which the semiconductor substrate 1 is covered by the protective layer 6.

The attached plan view shows the protective layer 6, which is subdivided into individual areas within the cell rows 110 by the fillings of the trench capacitors 3 and between the cell rows 110 by isolator structures 2. The areas of the protective layer 6 each rest on the substrate surface 10 in the area of the semiconductor fins 11.

Figure 4B:
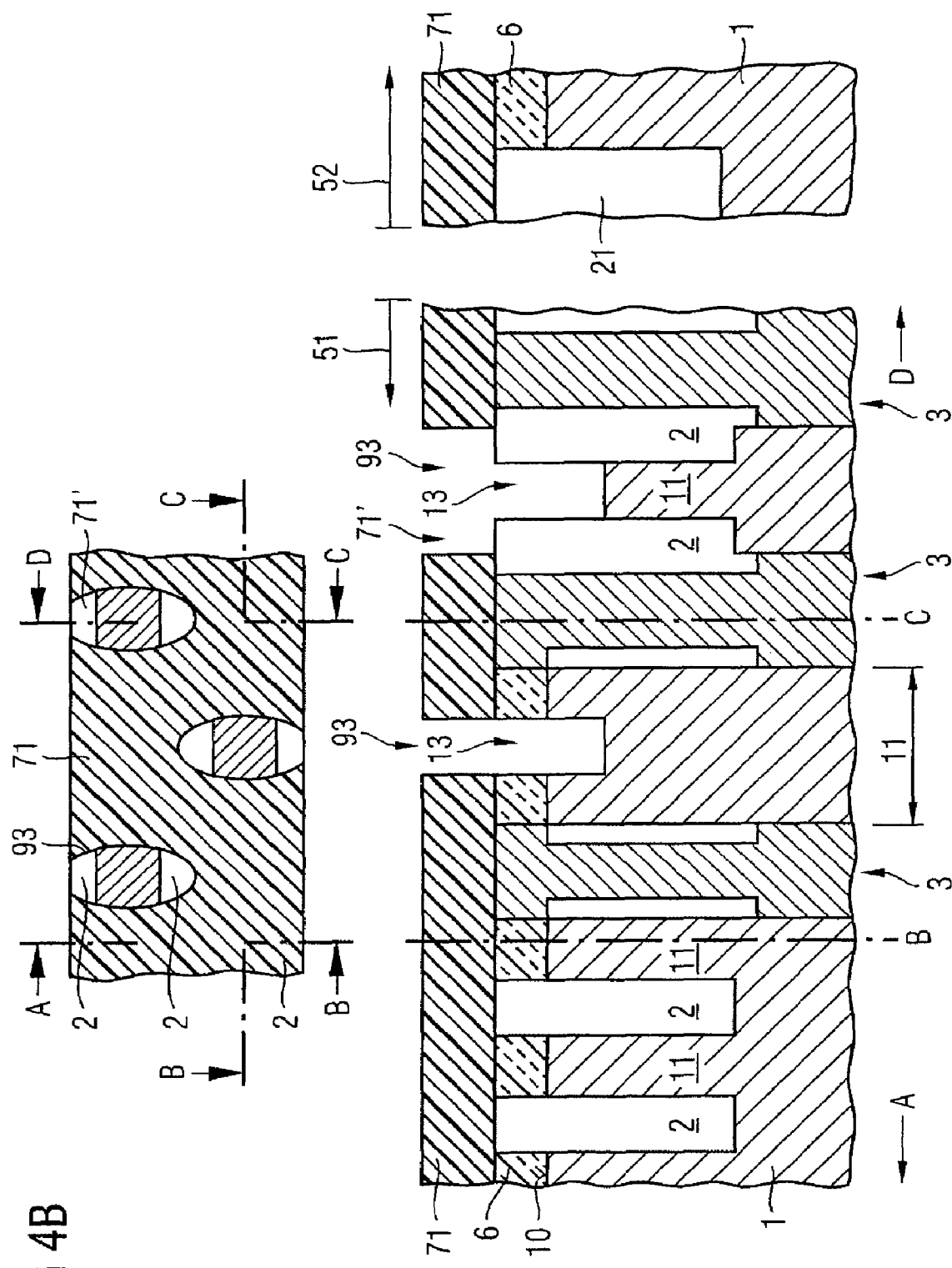

A groove mask layer is applied to and is photolithographically structured on the process surface, which is formed in places from the areas of the protective layer 6, the isolator structures 2 and the fillings 31 in the trench capacitors 3. In this case, a groove mask 71 with window openings 71' is produced from the groove mask layer in the projection of central sections of the semiconductor fins 11 (FIG. 4B). In the area of the window openings 71', the protective layer 6 is exposed in the projection of the central sections of the semiconductor fins 11 as well as sections of the isolator structures 2 adjacent to the central sections.

The material of the protective layer 6 is re-formed selectively with respect to the material of the groove mask 71 and the material of the isolator structures 2 as far as the substrate surface 10, with the central sections of the semiconductor fins 11 being exposed. The exposed central sections of the semiconductor fins 11 are re-formed, with gate trenches 13 being incorporated in the semiconductor fins 11.

As can be seen from FIG. 4B, gate trenches 13 are incorporated in each of the central sections of the semiconductor fins 11. The gate trenches 13 are in each case bounded within the cell row by those sections of the semiconductor fins 11 which have not been etched back, and at right angles to the cell row, corresponding to the section C-D in the cross section, by the isolator structures 2.

Figure 4C:
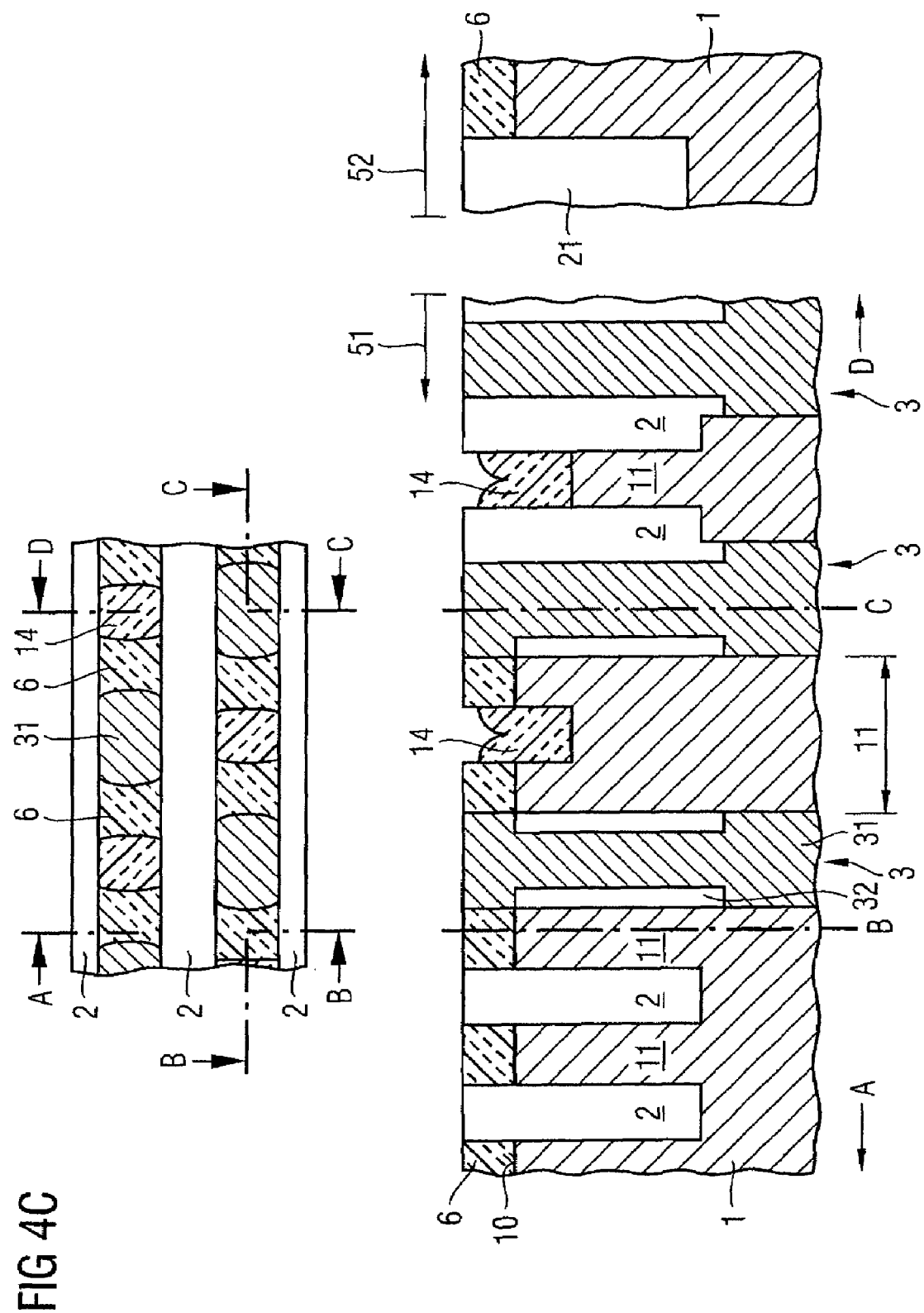

The groove mask 71 is removed, and the exposed semiconductor substrate 1 is oxidized. Oxynitride is deposited, with the gate trenches 13 being filled. The deposited oxynitride is re-formed as far as the upper edge of the protective layer 6. As shown in FIG. 4C, the gate trenches 13 are each filled with gate trench structures 14.

The supporting circuit area 52 is covered by an auxiliary mask 72. In the cell array 51, the isolator structures 2 are re-formed selectively with respect to silicon and silicon nitride as far as the lower edge of the word lines that are to be provided.

Figure 4D:
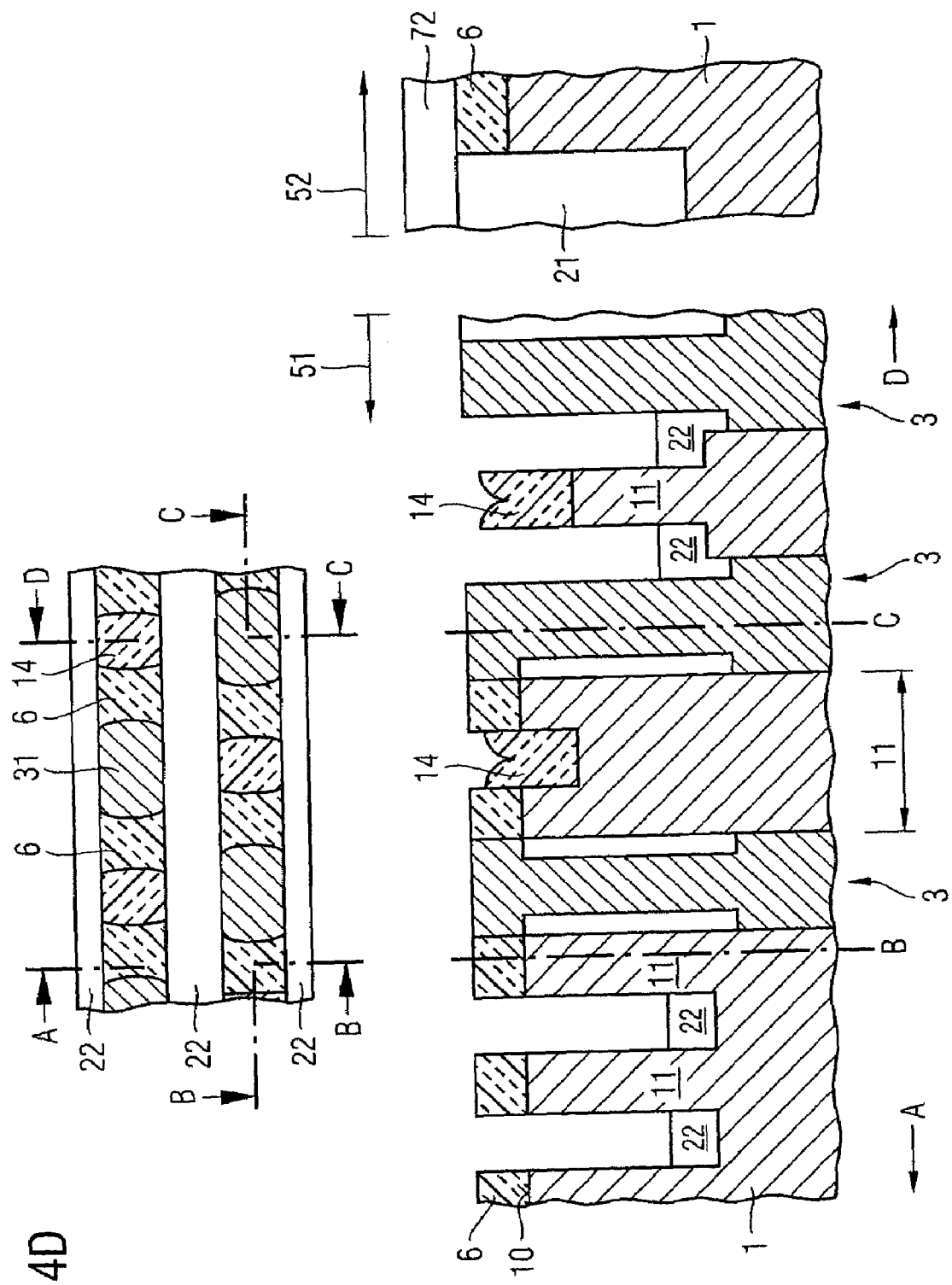

As shown in FIG. 4D, base isolators 22 remain in the isolator trenches underneath the lower edge of the word lines that are to be provided. The supporting circuit area 52 is covered by the auxiliary mask 72. As shown in the sections A-B and C-D of the cross section, the longitudinal faces of the semiconductor fins 11 are exposed.

Spacer word lines are formed. For this purpose, a gate dielectric 20 is provided on the exposed longitudinal faces of the semiconductor fins 11, for example by oxidation of the semiconductor substrate 1 or by deposition of a dielectric material. A conductive material is deposited with a high degree of conformity and is anisotropically etched back, with strands of word lines 23, 23' which run along the side walls of the semiconductor fins 11 and of the exposed upper sections of the trench capacitors 3 being formed. The word lines 23, 23' are re-formed to underneath the substrate surface 10.

Starting from the isolator trenches 2, the semiconductor fins 11 are doped above the upper edge of the word lines 23, 23', with first and second source/drain areas 121, 122 being formed. The doping is carried out, for example, by oblique ion implantation, by doping from the gas phase, or by the deposition of a highly doped material (doped glass) with the dopant subsequently being forced out from the highly doped material into the adjacent semiconductor substrate 1.

A dielectric material is deposited, for example silicon oxide. In the process, the isolator trenches are filled. The deposited dielectric material is removed and planarized as far as the upper edge of the protective layer 6.

Figure 4E:
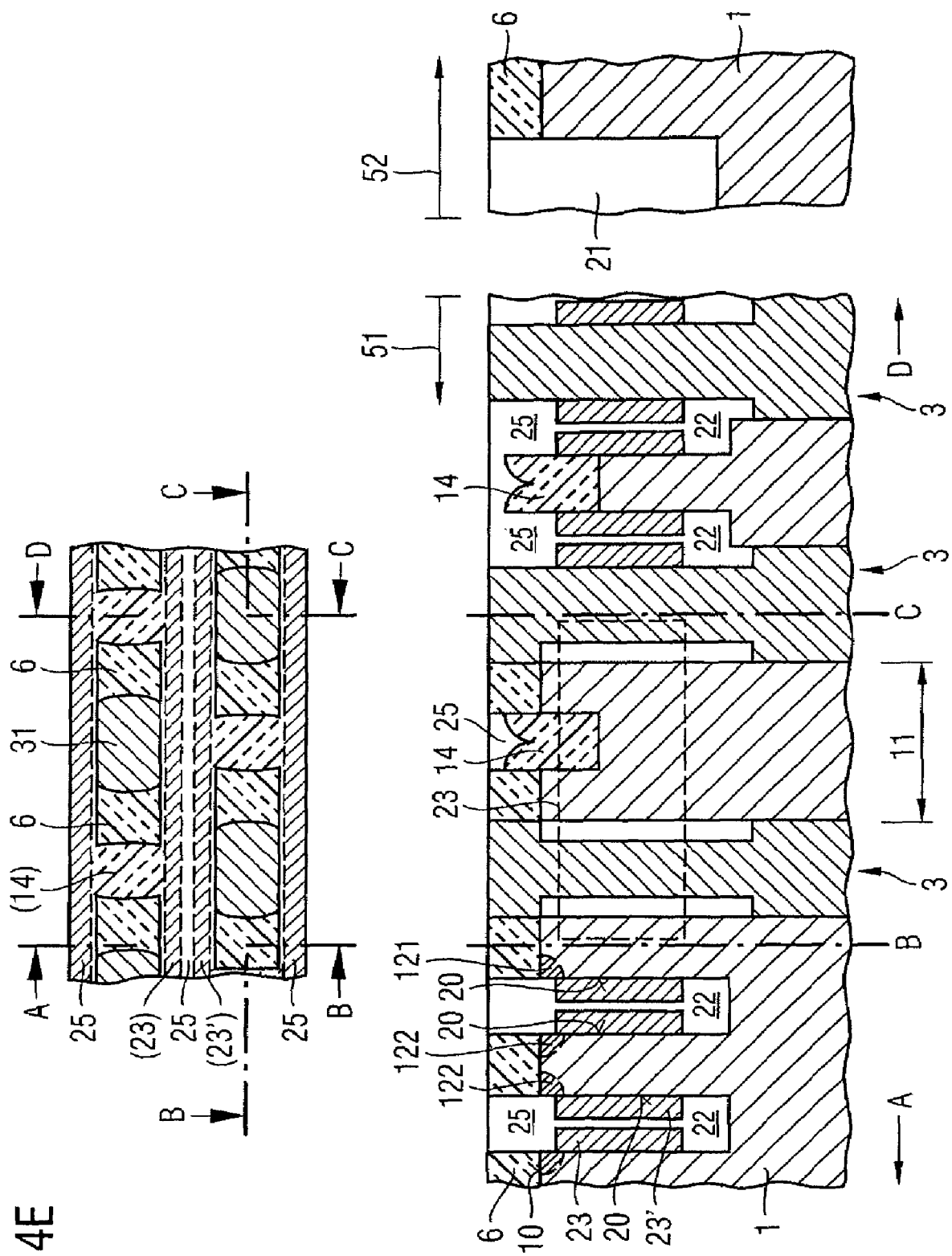

This results in the structure illustrated in FIG. 4E. Two isolator trenches 2 with a semiconductor fin 11 located between them are illustrated in the section A-B of the cross section. Pairs of word line strands 23, 23' are in each case arranged in the isolator trenches 2. A word line is in this case formed by two word line strands 23, 23' which are opposite one another on the semiconductor fin 11. The word lines are in each case isolated from the semiconductor substrate 1 underneath them by means of a base isolator structure 22. Above the word line strands 23, 23', the isolator trenches are filled with a dielectric filling 25 as far as the upper edge of the protective layer 6, by means of which the word line strands 23, 23' in the same isolator trench are also isolated from one another.

Above the upper edge of the word lines 23, 23', first and second source/drain areas 121, 122 are incorporated as doped regions in the illustrated semiconductor fin 11, starting from the isolator trenches 2.

In the section B-C, the word lines 23, 23' are formed in planes parallel to the section plane, as illustrated by dashed lines in FIG. 4E.

In plan view of FIG. 4E, the word line strands 23, 23' are covered by the dielectric filling 25, and their outlines are represented by dashed lines.

Figure 4F:
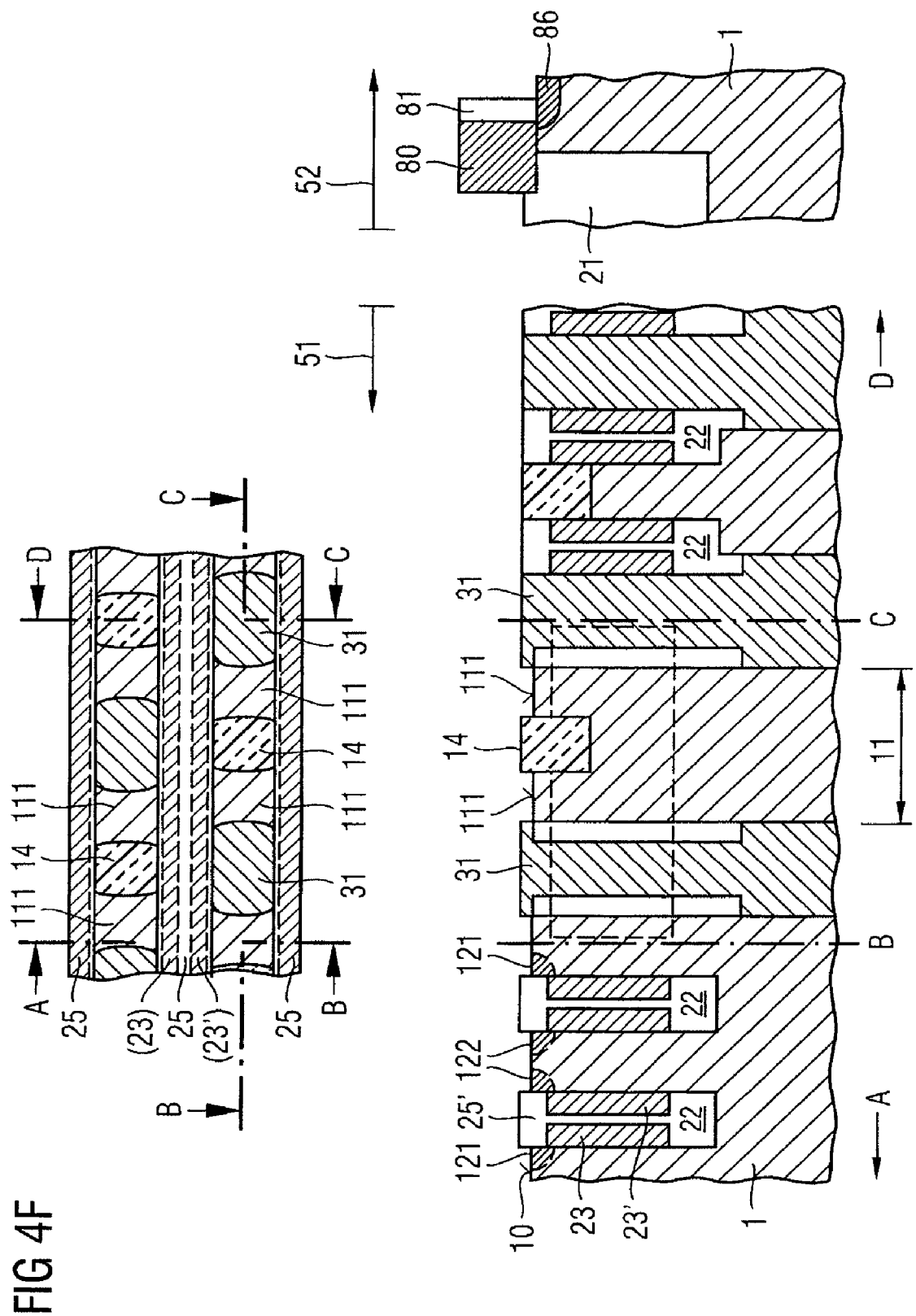

The protective layer 6 is removed and, in the process, the substrate surface 10 of the semiconductor substrate 1 is exposed in the area of the semiconductor fins 11. In this case, the silicon nitride of the protective layer 6 as well as the silicon oxide of the dielectric filling 25 are preferably etched back in the same etching step. The exposed sections of the semiconductor substrate 1 are covered with a sacrificial oxide 111 (FIG. 4F). Well implantations are carried out.

After the well implantations, the sacrificial oxide 111 is removed, and a support gate oxide is grown. The gate oxide for transistors in the supporting circuit area 52 is produced from the support gate oxide.

A layer of polysilicon is deposited. Gate conductor structures 80 which rest on the support gate oxide are produced in the supporting circuit area 52 by structuring of the deposited polysilicon. The formation of side wall isolator structures 81 as well as the doping of source/drain areas 86 in the supporting circuit area 52 result in transistors being formed in the supporting circuit area. The cell array 51 can be covered by a blocking mask during the processing of the supporting circuit area 52.

As can be seen from FIG. 4F, encapsulated gate conductor structures 80 as well as support doping areas 86 are formed by vertical side wall isolator structures 81 in the supporting circuit area 52.

First and second source/drain areas 121, 122 are formed in the cell array 51, and their lower edges are in each case adjusted with respect to the upper edges of the word lines 23, 23'. The semiconductor substrate 1 is covered by the protective layer 111 in the sections which were previously covered by the protective layer 6. The gate trench structures 14, the dielectric filling 25 and the filling 31 in the hole trench capacitors 3 are re-formed. In this exemplary embodiment, the upper edges of the re-formed dielectric fillings 25', of the gate conductor structures 14 and of the fillings 31 in the trench capacitors 3 are each provided with the upper edge above the substrate surface 10.

As can be seen from the plan view of FIG. 4F, two exposed sections of the semiconductor substrate 1, which are then covered with the sacrificial oxide 111, in the cell row are in each case adjacent to the trench capacitor filling 31 on mutually opposite sides of a trench capacitor. The filling 31 is generally composed of doped polysilicon. The semiconductor substrate 1 is monocrystalline silicon. Two exposed sections and the filling 31 held in the two sections in each case form a cohesive basic structure composed of silicon. Within the same cell row 110, the basic structures are separated from one another by the gate trench structures 14, which are composed of oxynitride.

Mutually adjacent cell rows 110 are separated from one another by the re-formed dielectric filling 25'.

In the cell array 51, the support gate oxide is removed, and silicon is grown on a material-selective basis on the structure which is illustrated in the form of a plan view in FIG. 4F. The silicon grows on the filling 31 and on the exposed sections of the semiconductor fins 1 in the vertical direction, and to a lesser extent in the horizontal direction as well. A collar isolator 32, which may still be provided between the filling 31 and the adjacent exposed sections, is grown over. The growing silicon forms provisional connections 73 which rest on the basic structures.

Figure 4G:
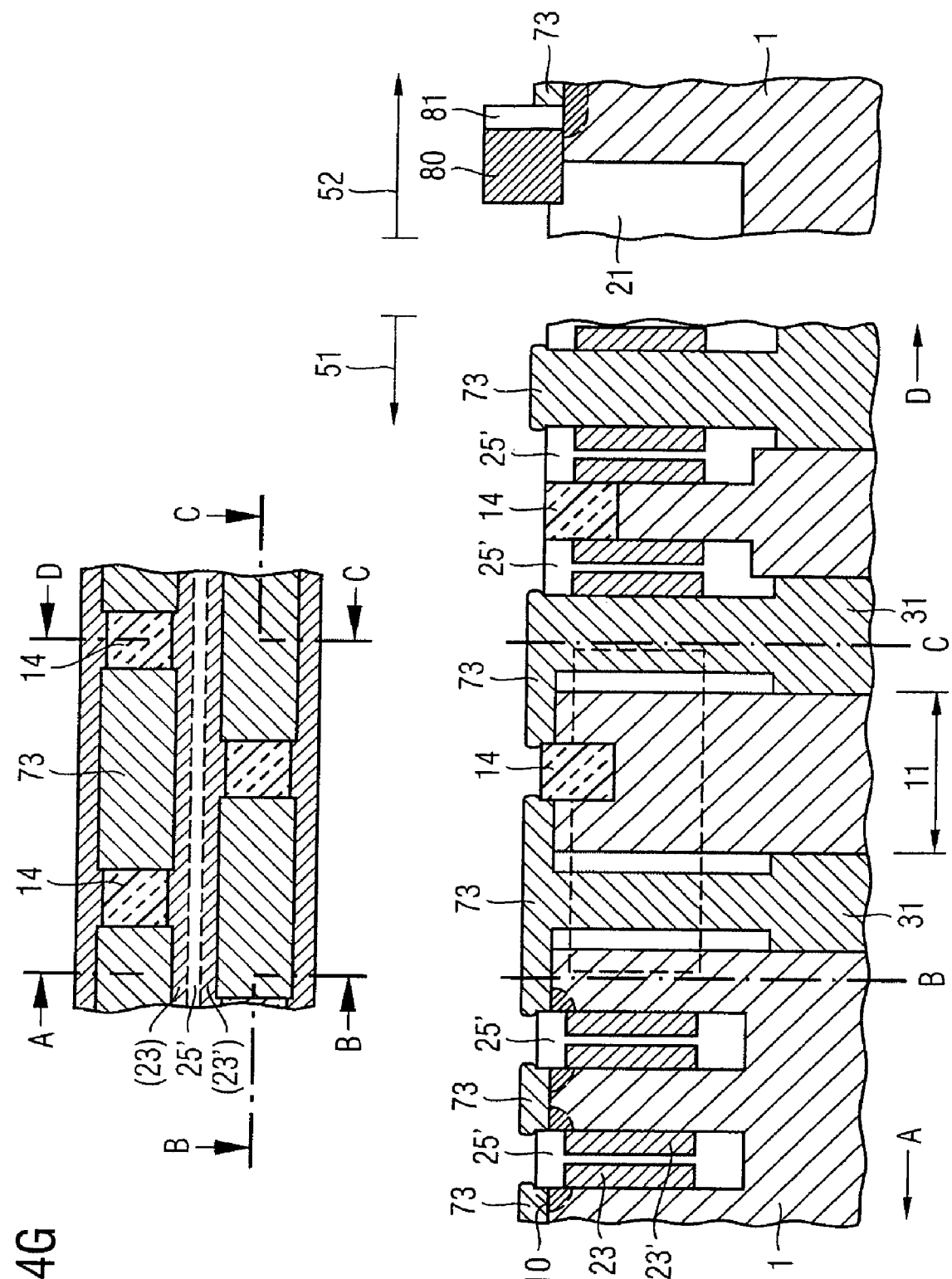

The provisional connections 73 are illustrated in FIG. 4G. The provisional connections 73 are located on the basic structures that are formed from silicon. The provisional connections in the cell rows are separated from one another by the gate trench structures 14, and are separated from adjacent cell rows by the dielectric filling 25'

As illustrated by the section B-C in the section illustration of FIG. 4G, the provisional connections 73 are each located on two exposed sections of the semiconductor substrate 1 which are adjacent to the filling 31 and are associated with mutually adjacent memory cells.

A cut mask layer is applied and is structured in a photolithographic step (FIG. 4H), with a cut mask 74 with cut openings 74' being produced from the cut mask layer. One section of a provisional connection 73 is in each case exposed by the cut openings 74', in each case between the filling 31 and the semiconductor fin of the memory cell which is adjacent in the same cell row.

The provisional connections 73 and the sections of the semiconductor substrate 1 and/or of the fillings 31 located underneath are removed and are re-formed at least as far as the upper edge of the unthinned section of the collar insulator 32, or underneath it.

Figure 4H:
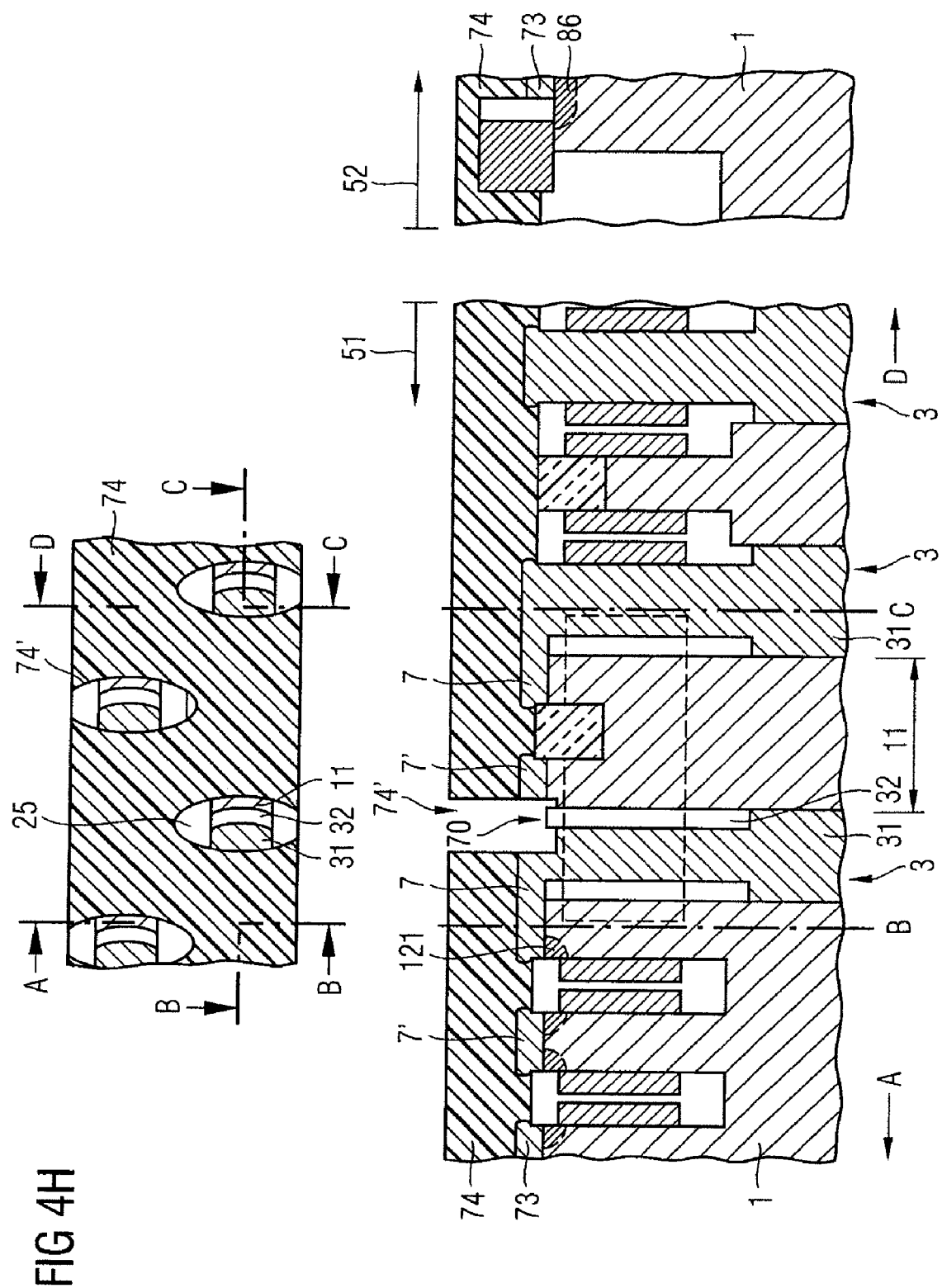

As illustrated in FIG. 4H, the previous provisional connections 73 are in each case cut through by a cut 70 into a surface connection or a surface strap 7, and a bit contact connection or a BC strap 7'. The surface strap 7 connects the filling 31 to the first source/drain area 121 of that selection transistor which is adjacent on the left in the same cell row. The bit contact strap 7', which is formed from the same provisional connection, is located on the second source/drain area 122 of the selection transistor in the adjacent memory cell on the right.

In the plan view of FIG. 4H, the filling 31 in a trench capacitor as well as the surface of the semiconductor fin 11 of the adjacent selection transistor on the right in the cell row can be seen through each of the cut openings 74' in the cut mask 74, and are separated from one another by a section of the collar isolator 32 of the trench capacitor.

The selective growth of silicon is followed by self-adjusted silicidation (salicidation).

Figure 4I:
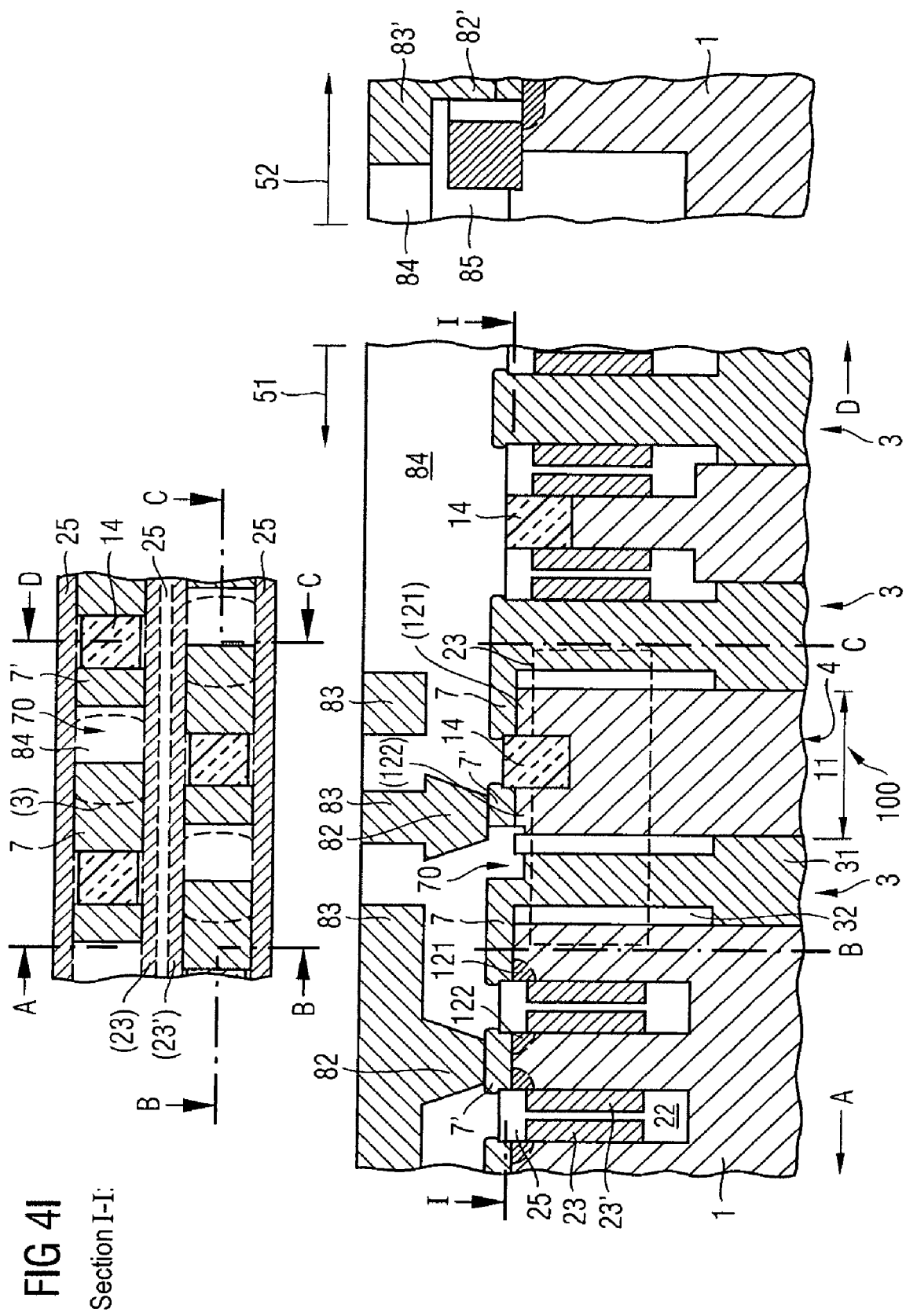

A dielectric layer is applied and planarized, as a first layer element of an intermediate layer dielectric 84 (FIG. 4I). Contact holes are etched through the dielectric layer to the BC straps 7', and are filled with a conductive material, by means of a photolithographic step. Bit lines 83, which run at right angles to the cell rows, are formed by deposition of a further layer element of the intermediate layer dielectric 84 and a further lithographic step.

This is followed by a conventional BEOL process in order to complete a DRAM semiconductor component.

The trench DRAM cell array produced using the method according to the invention is illustrated in FIG. 4I. A memory cell 100 is illustrated in the form of a longitudinal section, in the section B-C illustration of FIG. 4I. The memory cell 100 has a trench capacitor 3' and, adjacent to it on the left, a CFET as a selection transistor 4' with an active region 12, which is formed in a semiconductor fin 11. The active region 12 comprises a first source/drain area 121, which is connected via a surface connection or surface strap 7, which is located on it, to the filling 31 of the associated trench capacitor 3'. The active region 12 furthermore comprises a second source/drain area 122, which is isolated by a collar isolator 32 and by a dielectric filling in the cut 70 from the trench capacitor 3 of the adjacent memory cell 100 on the left in the same cell row. A gate trench structure 14 composed of a dielectric material is incorporated between the two source/drain areas 121, 122. Furthermore, the active region 12 has a body area 123, by means of which the two source/drain areas 121, 122 are connected to one another underneath the gate trench structure 14.

Strands of word lines 23, 23' run along the longitudinal faces of the semiconductor fin 11. A gate dielectric 20 is in each case formed between the word line strands 23, 23' and the semiconductor fins 11. In the section B-C of the section illustration, the word line strands 23, 23' run on planes parallel to the section plane, and are represented by dashed lines.

A BC strap 7' composed of grown silicon is in each case located on the second source/drain areas 122. The bit lines 83 are in each case connected via bit contacts 82 and the bit contact straps 7' to the second source/drain area 122.

The word line strands 23, 23' form gate electrodes, which are opposite one another in places, of the selection transistors 4, through which the word lines 23, 23' pass.

When a suitable potential is applied to mutually associated word line strands 23, 23', a conductive channel is in each case formed along the longitudinal faces of the semiconductor fins 11 in the body areas 123 of the selection transistors 4 which are being addressed.

The surface strap 7 in each case reduces the resistance between the filling 31 of the trench capacitor 3, 3' and the first source/drain area 121 of the selection transistor 4 that is associated with the respective trench capacitor 3, 3'. The BC strap 7' reduces the contact resistance between the bit contact 82 and the respective second source/drain area 122.

Figure 5:
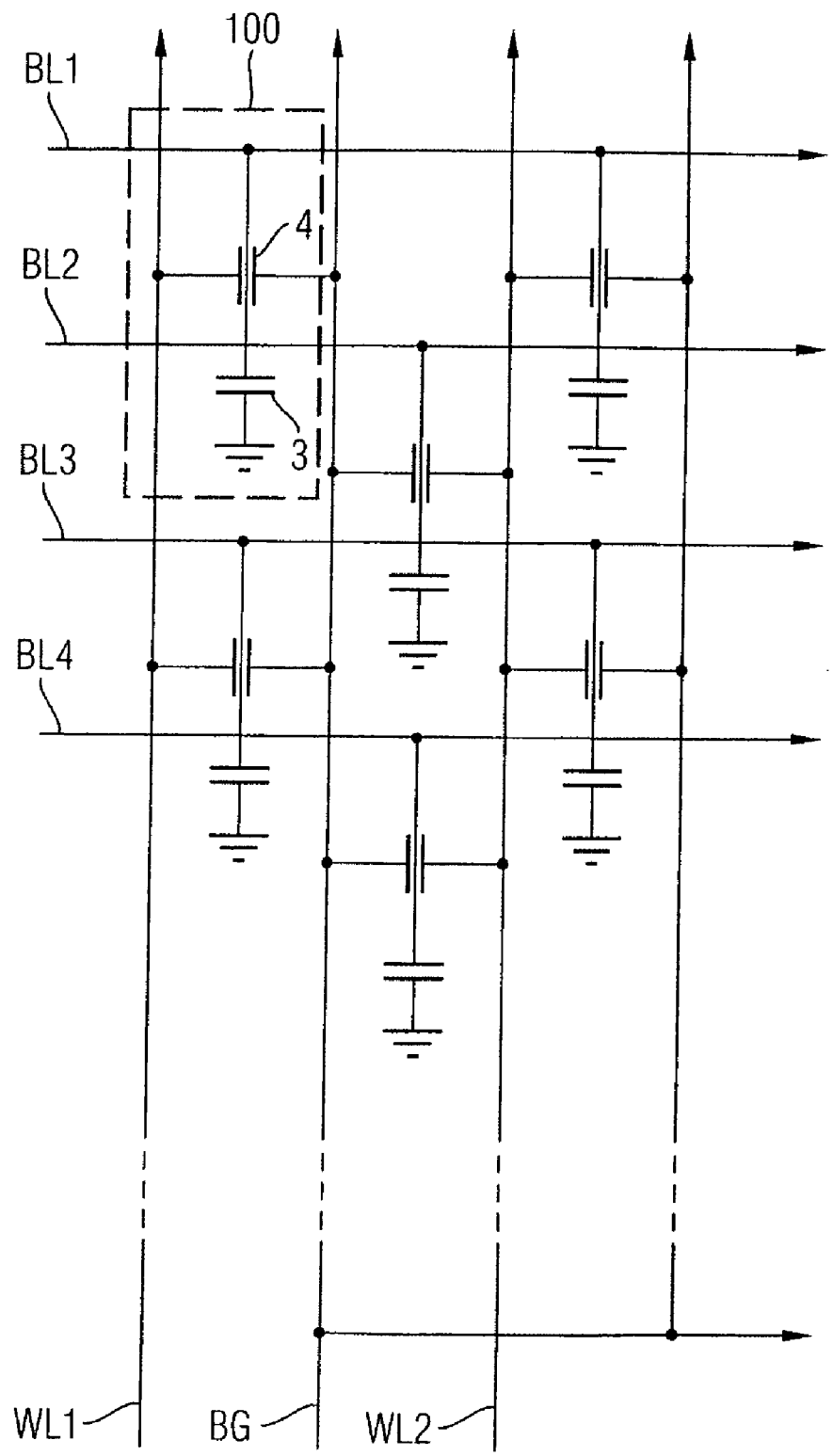
FIG. 5 depicts a topographic circuit diagram of a trench DRAM cell array as shown in FIG. 6 with an open bit line architecture.

FIG. 5 shows the routing of the word lines for the provision of an open bit line architecture. The word line WL2 which runs along the cell row in an isolator trench acts as a gate electrode for selection transistors 4 which are in each case arranged alternately in the two cell rows adjacent to the isolator structure. Each word line WL1, WL2, WLn addresses memory cells in each bit line BL1, BL2, BLn. Each second word line is in the form of a backgate or backward gate electrode. The backward gate electrodes are connected to a suitable potential. Since each bit line BLn is in each case addressed by one word line WLn, the respective reference signal for the read amplifier is normally not obtained from the cell array itself.

The drawings in FIGS. 6A-6G show processing for a trench DRAM cell array with buried word lines and CFETs as selection transistors using an open bit line architecture.

Figure 6A:
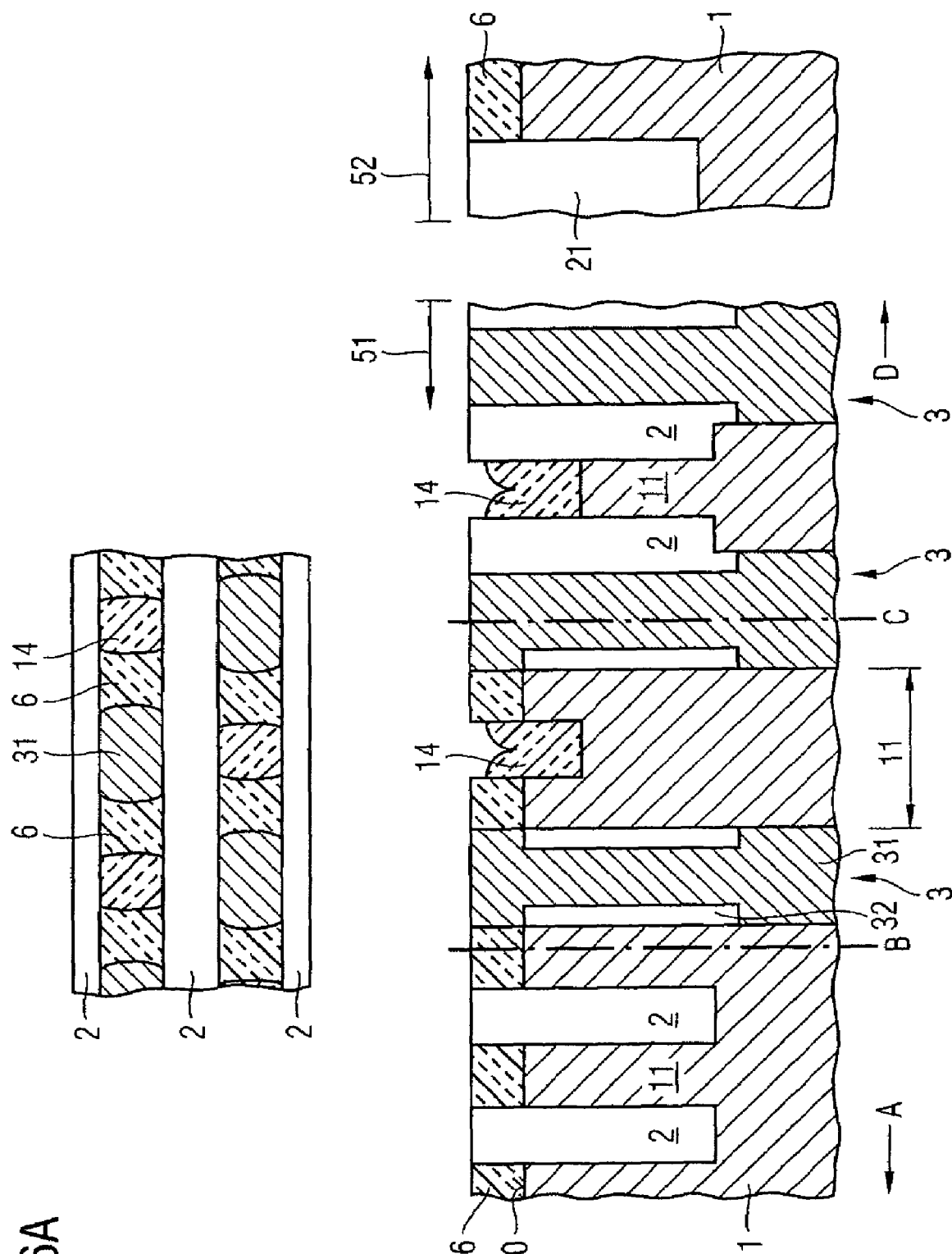

The processing in this case follows the processing illustrated in FIGS. 4A-4I, as far as the formation of the gate trench structures 14. FIG. 6A in this case corresponds to the already described FIG. 4C.

Starting from the structure illustrated in FIG. 6A, a trench auxiliary mask is produced with mask sections 75 which adjust themselves with respect to the fillings 31 in the trench capacitors 3. In this case, from the mask sections 75, and starting from exposed surface of the filling 31, sections of the isolator structures 2 which are adjacent to the filling 31 are grown over with a uniform width in each case. The isolator structures 2 are in this case covered, starting from the fillings 31 up to a maximum of half the distance between two cell rows 110. Sections of the isolator structures 2 which are in each case adjacent to the semiconductor fins 11 remain uncovered.

The partially covered isolator structures 2 are re-formed anisotropically and selectively in the uncovered sections to the silicon of the mask 75 and the silicon nitride of the protective layer 6, or the material of the gate trench structures 14. Sections of the isolator structures 2 which are covered by the mask sections 75 and are adjacent to the trench capacitors are retained, and form word line/trench isolators 26. Sections of the isolator structures 2 which are in each case adjacent to the semiconductor fins 11 are reformed. The supporting circuit area 52 is in this case covered by a blocking mask.

Figure 6B:
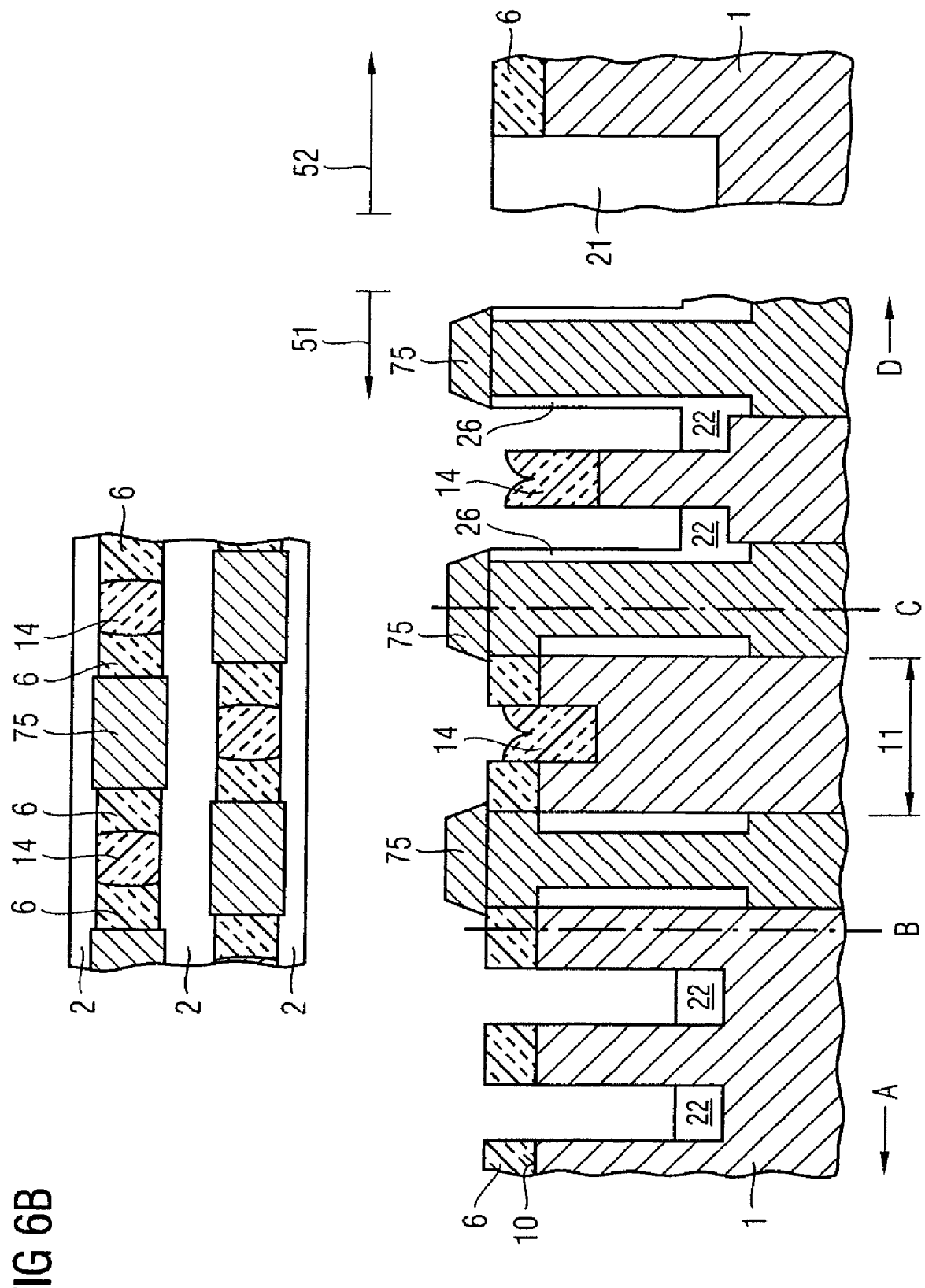

The mask sections 75 of the auxiliary trench mask 75 can be seen in the attached plan view in FIG. 6B. The mask sections 75 are adjusted with respect to the fillings 31 in the trench capacitors 3, and overlap those sections of the isolator structures 2 which are adjacent to the filling 31, as well as the protective layer 6. In the sections which are not covered by the mask sections 75, the isolator structures 2 are re-formed to below a lower edge of the word lines to be formed, and form base isolators 22. Word line/trench isolators 26 are formed from the previous isolator structures 2 underneath those sections which are covered by the mask sections 75.

A gate dielectric is provided on those longitudinal faces of the semiconductor fins 11 which are exposed by etching back the isolator structures 2. A conductive material is deposited in order to form the word lines, and is re-formed to below the substrate surface 10 of the semiconductor substrate 1. The source/drain areas 121, 122 are formed analogously to the process already described in FIG. 4E.

Figure 6C:
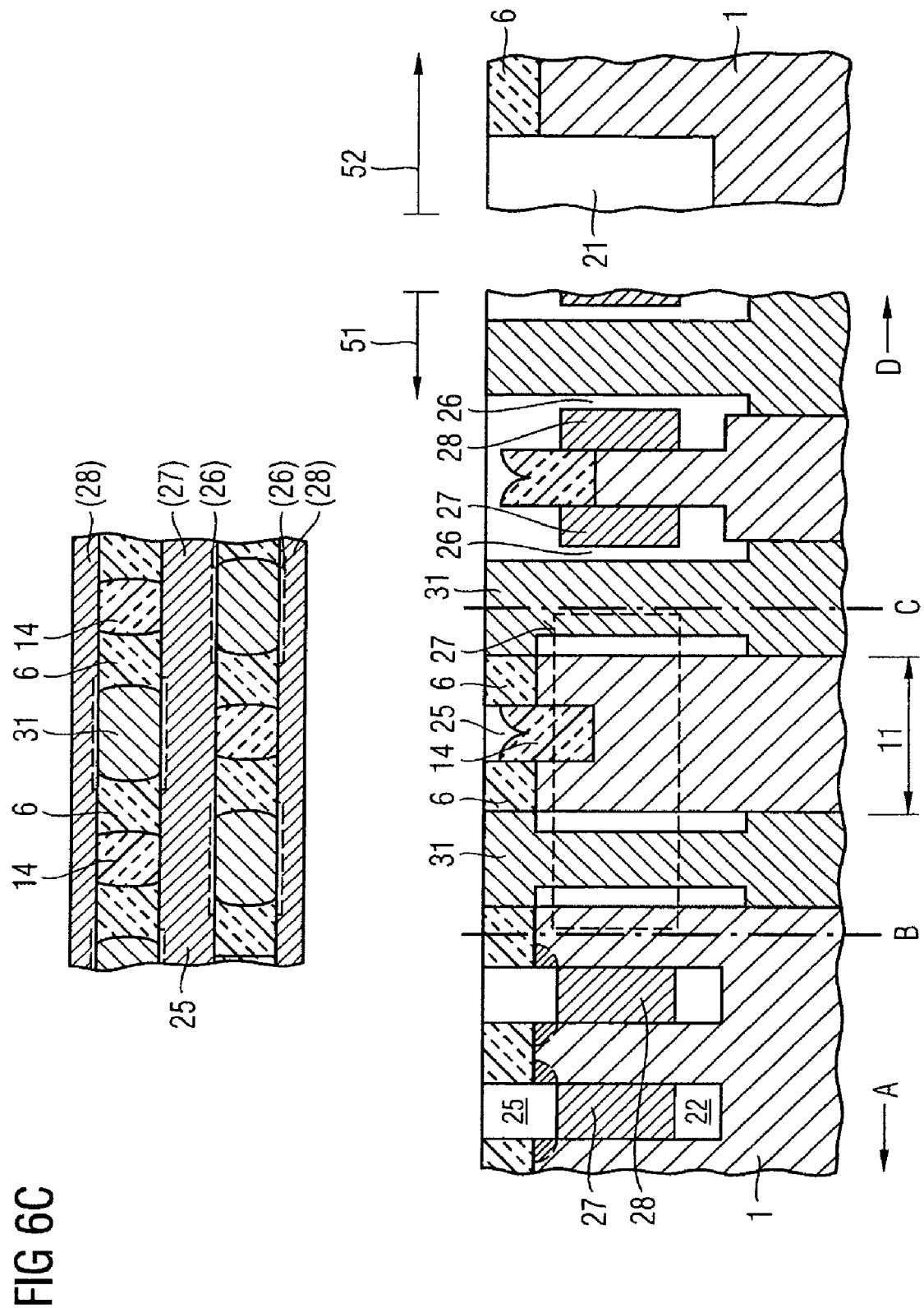
Figure 6D:
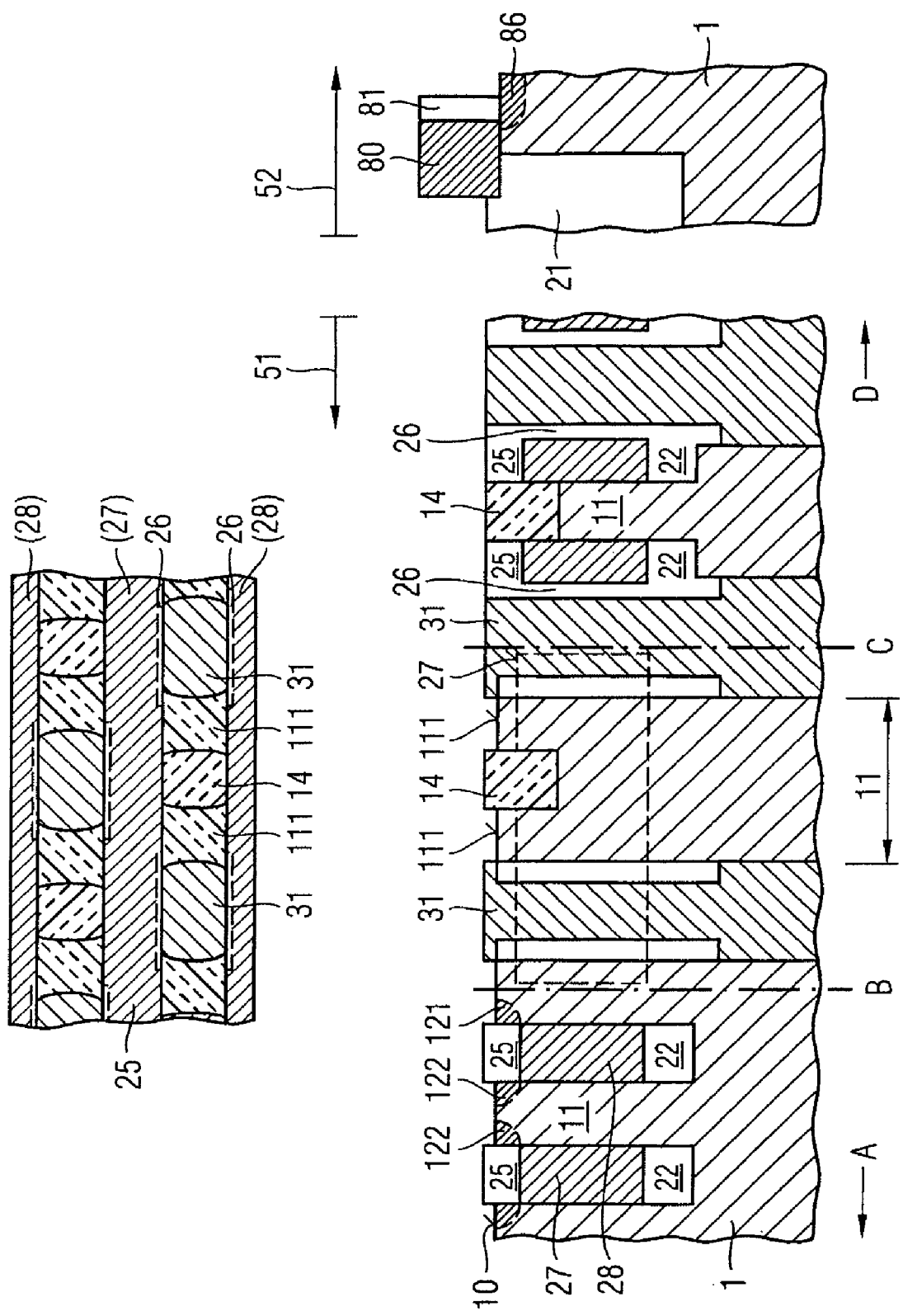
Figure 6E:
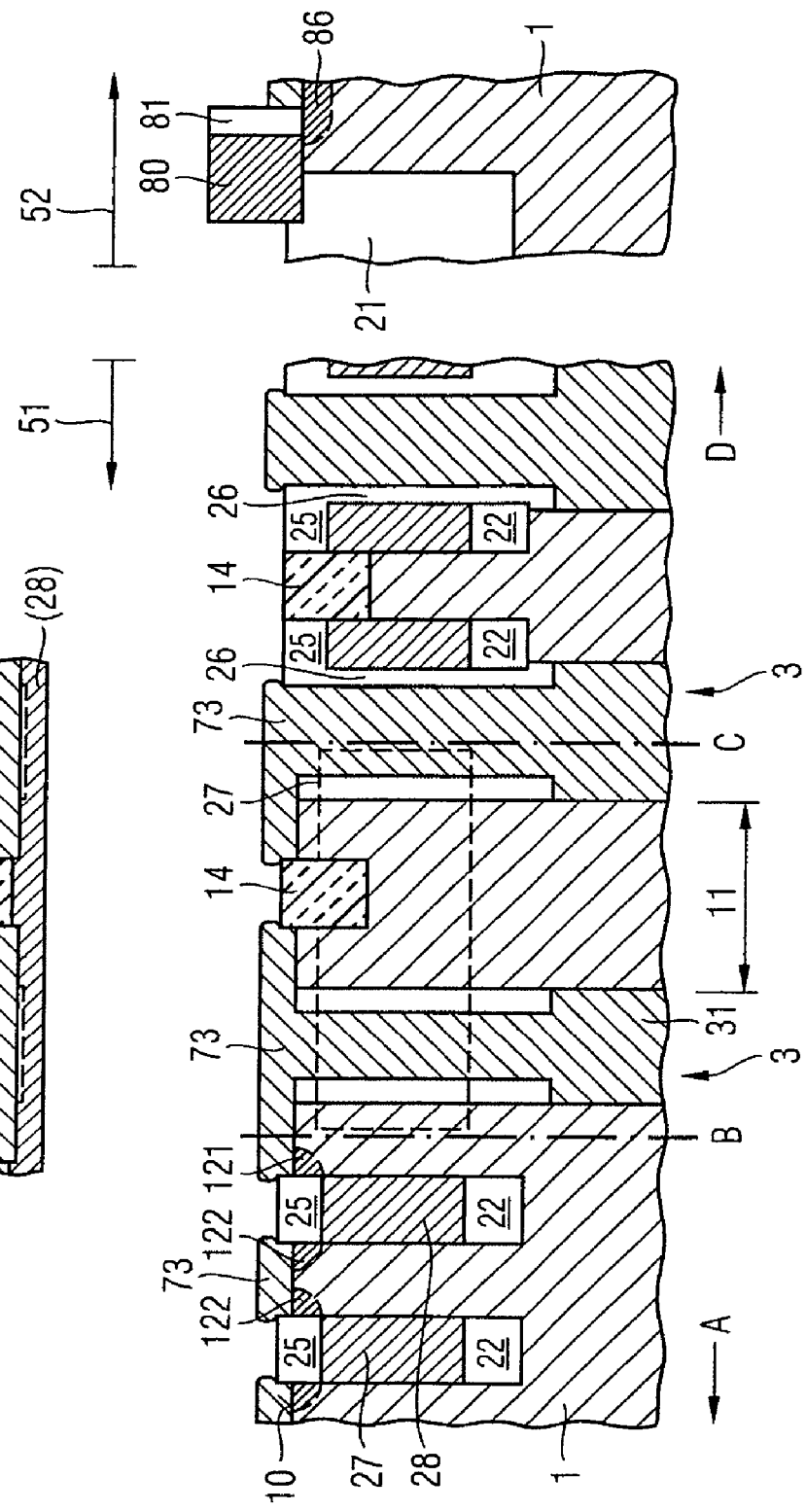

With the exception of the formation of the word lines 27, 28 and of the word line/trench isolator 26, FIG. 6C corresponds to FIG. 4E. Only one word line 27, 28 is provided per isolator structure 2. Every alternate word line 28 is in the form of a backgate, and is connected to a defined potential.

As can be seen from the plan view of FIG. 6C, the word lines 27, 28 completely fill the isolator trenches between two cell rows 110, and in this case are isolated from the filling 31 of the trench capacitors 3 by word line/trench isolators 26.

The processing illustrated in FIGS. 6D to 6G corresponds essentially to the processing already described with reference to FIGS. 4F to 4I.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Semiconductor substrate
10 Substrate surface
11 Semiconductor fin
111 Sacrificial oxide
12 Active region
121 First S/D area
122 Second S/D area
123 Body area
13 Gate trench
14 Gate trench structure
2 Isolator structure
2' Provisional isolator structure
20 Gate dielectric
21 Flat trench isolator structure
22 Base isolator
23 Word line
23' Word line
25 Dielectric filling
25' Re-formed dielectric filling
26 Word line/trench isolator
27 Word line
28 Backgate
3 Trench capacitor
31 Trench filling
32 Collar isolator
35 Capacitor dielectric
4 Selection transistor
51 Cell array area
52 Supporting circuit area
6 Protective layer
7 Surface connection
7' Bit contact connection
70 Cut
71 Groove mask
71' Window openings in the groove mask
72 Auxiliary mask
73 Provisional connection
74 Cut mask
74' Window opening in the cut mask layer
75 Mask sections of the trench auxiliary mask
76 Bit contact mask
80 Gate conductor structure
81 side wall isolator structure
82 Bit contact
82' Bit contact
83 Bit line
83' Bit line
84 Intermediate layer dielectric
85 Isolator cap
86 Support doping
91 Window opening in the trench mask
92 Web section of the isolator mask
93 Window opening in the groove mask
94 Window opening in the cut mask
95 Window opening in the bit contact mask
96 Fin section of the bit line mask
100 Memory cell
110 Cell row
BLn Bit line
WLn Word line
WLnA First word line branch
WLnB Second word line branch
BG Backgate

What is claimed is:

1. A method for producing trench DRAM cells comprising
introducing trench capacitors into a substrate, wherein the trench capacitors are arranged to form cell rows and each trench capacitor includes an internal electrode, wherein fins are formed from the substrate within the cell rows, each fin being bounded by two adjacent trench capacitors;
introducing gate trench structures into the fins, wherein each gate trench structure is introduced into a central section of a corresponding fin;
selectively growing provisional connections on the internal electrodes and on outer sections of the fins, wherein each internal electrode is connected via a corresponding provisional connection to two fins that are adjacent in the corresponding cell row; and
removing portions of the provisional connections between the respective internal electrode and one of the two adjacent fins so as to form surface connections connecting each trench capacitor to one fin.

2. The method of claim 1, wherein the trench capacitors include collar isolators formed in upper sections of the trench capacitors adjacent the substrate surface so as to isolate the internal electrodes in their upper sections from the substrate before providing at least the upper sections of the internal electrodes, and the method further comprises:
thinning of the collar isolators.

3. The method of claim 1, further comprising:
providing strip-like isolator structures, wherein the isolator structures separate each of the cell rows from each other and include buried word lines, each semiconductor fin is bounded by two adjacent isolator structures and two adjacent trench capacitors; and
providing a protective layer on the substrate before the formation of the trench capacitors, wherein the trench capacitors and the isolator structures are introduced into the substrate through the protective layer.

4. The method of claim 3, wherein the introduction of the gate trench structures comprises:
providing a photolithographically structured groove mask on the protective layer, wherein the groove mask includes window openings corresponding with the central sections of the fins;
imaging of the structure of the groove mask into the protective layer, with sections of the protective layer being removed underneath the window openings;
imaging of the structure of the protective layer into the substrate, with gate trenches being introduced into the central sections of the fins; and
filling the gate trenches with the gate trench structures.

5. The method of claim 4, wherein the filling of the gate trenches comprises:
oxidizing the substrate;
depositing oxynitride in the gate trenches; and
etching back the oxynitride as far as an upper edge of the protective layer.

6. The method of claim 3, wherein providing the isolator structures with word lines comprises:
introducing isolator trenches which separate the cell rows from each other;
filling each isolator trench with a provisional structure comprising a dielectric material before the introduction of the gate trench structures;
re-forming the provisional structures as far as a lower edge of the word lines after the incorporation of the gate trench structures, with base isolator structures being formed underneath the lower edge of the provisional structures;
providing a gate dielectric on exposed vertical side walls of the fins;
providing word lines in the isolator trenches, wherein the word lines are isolated from the fins by the gate dielectric; and
filling the isolator trenches with a dielectric material.

7. The method of claim 6, wherein the word lines are provided by conformally depositing conductive material, and the conductive material is re-formed anisotropically so that spacer word lines that extend along side walls of the isolator trenches are formed.

8. The method of claim 6, further comprising:
producing a trench auxiliary mask including mask sections that are adjusted to fillings of the trench capacitors, before the re-forming of the provisional structures, wherein sections of the provisional structures that are adjacent to the trench capacitors are covered by the mask sections, and sections which are adjacent to the fins remain uncovered;
anisotropically re-forming the provisional structures, with word line/trench isolators being formed underneath the mask sections; and
providing the word lines by deposition of conductive material and re-forming of the conductive material, with one word line being formed in each of the isolator trenches.

9. The method of claim 8, further comprising:
selectively growing silicon on the fillings of the trench capacitors before the re-forming of the provisional structures so as to form the trench auxiliary mask, wherein sections of the provisional structures that are adjacent to the trench structures are covered by the grown silicon.

10. The method of claim 3, further comprising:
removing the protective layer before selectively growing the provisional connections; and
covering exposed sections of the semiconductor substrate with a sacrificial oxide.

11. The method of claim 3, further comprising:
doping outer sections of the fins before selectively growing the provisional connections, wherein the doping is self-adjusted with respect to upper edges of the word lines and results in the formation of first and second source/drain areas of field-effect transistors including a curved channel at the doped outer sections.

12. The method of claim 1, further comprising:
performing self-adjusted silicidation of the provisional connections.

* * * * *